US012733481B2

(12) United States Patent
Lin et al.

(10) Patent No.: US 12,733,481 B2
(45) Date of Patent: Sep. 8, 2026

(54) DEVICE HAVING DIFFERENT FIRST METALLIZATION LAYER AND FIRST BURIED METALLIZATION LAYER ARCHITECTURES AND METHOD OF MANUFACTURING SAME

(71) Applicant: TAIWAN SEMICONDUCTOR MANUFACTURING COMPANY, LTD., Hsinchu (TW)

(72) Inventors: Chun-Yen Lin, Hsinchu (TW); Ching-Yu Huang, Hsinchu (TW); Wei-Cheng Lin, Hsinchu (TW); Jiann-Tyng Tzeng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 328 days.

(21) Appl. No.: 18/398,417

(22) Filed: Dec. 28, 2023

(65) Prior Publication Data

US 2025/0218945 A1 Jul. 3, 2025

(51) Int. Cl.

| | |
|---|---|
| ***H01L 23/528*** | (2006.01) |
| ***H10D 30/01*** | (2025.01) |
| ***H10D 30/43*** | (2025.01) |
| ***H10D 30/67*** | (2025.01) |
| ***H10D 62/10*** | (2025.01) |

(Continued)

(52) U.S. Cl.

CPC ........ *H10W 20/427* (2026.01); *H10D 30/014* (2025.01); *H10D 30/43* (2025.01); *H10D 30/6735* (2025.01); *H10D 30/6757* (2025.01); *H10D 62/121* (2025.01); *H10D 84/0167* (2025.01); *H10D 84/0186* (2025.01); *H10D 84/038* (2025.01); *H10D 84/85* (2025.01)

(58) Field of Classification Search

CPC .. H01L 23/5286; H10D 30/014; H10D 30/43; H10D 30/6735

See application file for complete search history.

(56) References Cited

U.S. PATENT DOCUMENTS

| | | | | |
|---|---|---|---|---|
| 9,806,019 | B2 * | 10/2017 | Jarrar | H10W 20/498 |
| 12,476,189 | B2 * | 11/2025 | Huang | H10W 20/20 |
| 2023/0067311 | A1 | 3/2023 | Lai et al. | |

FOREIGN PATENT DOCUMENTS

| | | |
|---|---|---|
| TW | 202245195 | 11/2022 |
| TW | 202314574 | 4/2023 |

* cited by examiner

*Primary Examiner* — Dale E Page
*Assistant Examiner* — Wilner Jean Baptiste
(74) *Attorney, Agent, or Firm* — Hauptman Ham, LLP

(57) ABSTRACT

A device includes: a first cell region stacked on a second cell region; each including a first active region over a second active region; in a first layer of metallization (M_first layer) over the first active region, M_first power grid (PG) segments having a first reference voltage and M_first routing segments aligned correspondingly to M_first routing tracks; and in a first layer of metallization (BM_first layer) under the second active region, BM_first PG segments having a second reference, and BM_first routing segments aligned correspondingly to BM_first routing tracks. The M_first routing segments are aligned in the first and second cell regions correspondingly to first (Q1) and second (Q2) quantities of the M_first routing tracks, where Q2<Q1. The BM_first routing segments are aligned in the first and second cell regions correspondingly to third and fourth quantities of the BM_first routing tracks, where Q4<Q3.

20 Claims, 24 Drawing Sheets

(51) Int. Cl.

| | |
|---|---|
| ***H10D 84/01*** | (2025.01) |
| ***H10D 84/03*** | (2025.01) |
| ***H10D 84/85*** | (2025.01) |
| ***H10W 20/41*** | (2026.01) |

100C
102(2) Tall
110(2) Short
102(3) Tall
110(3) Short
102(4) Tall
110(4) Short
102(5) Tall
110(5) Short
188(1)
188(2)
188(3)
188(4)
186
184
184
186
136
136
290, column
Z-axis
Y-axis
X-axis 100D
102(6) Tall
110(6) Short
102(7) Tall
102(3) Tall
110(7) Short
102(8) Tall
102(9) Tall
110(8) Short
188(5)
188(2)
188(6)
186
184
184
186
136
136
290, column 100E
110(9) Short
110(10) Short
102(3) Tall
110(3) Short
110(11) Short
102(10) Tall
110(12) Short
110(13) Short
188(7)
188(2)
188(8)
186
184
184
186
136
136
290, column

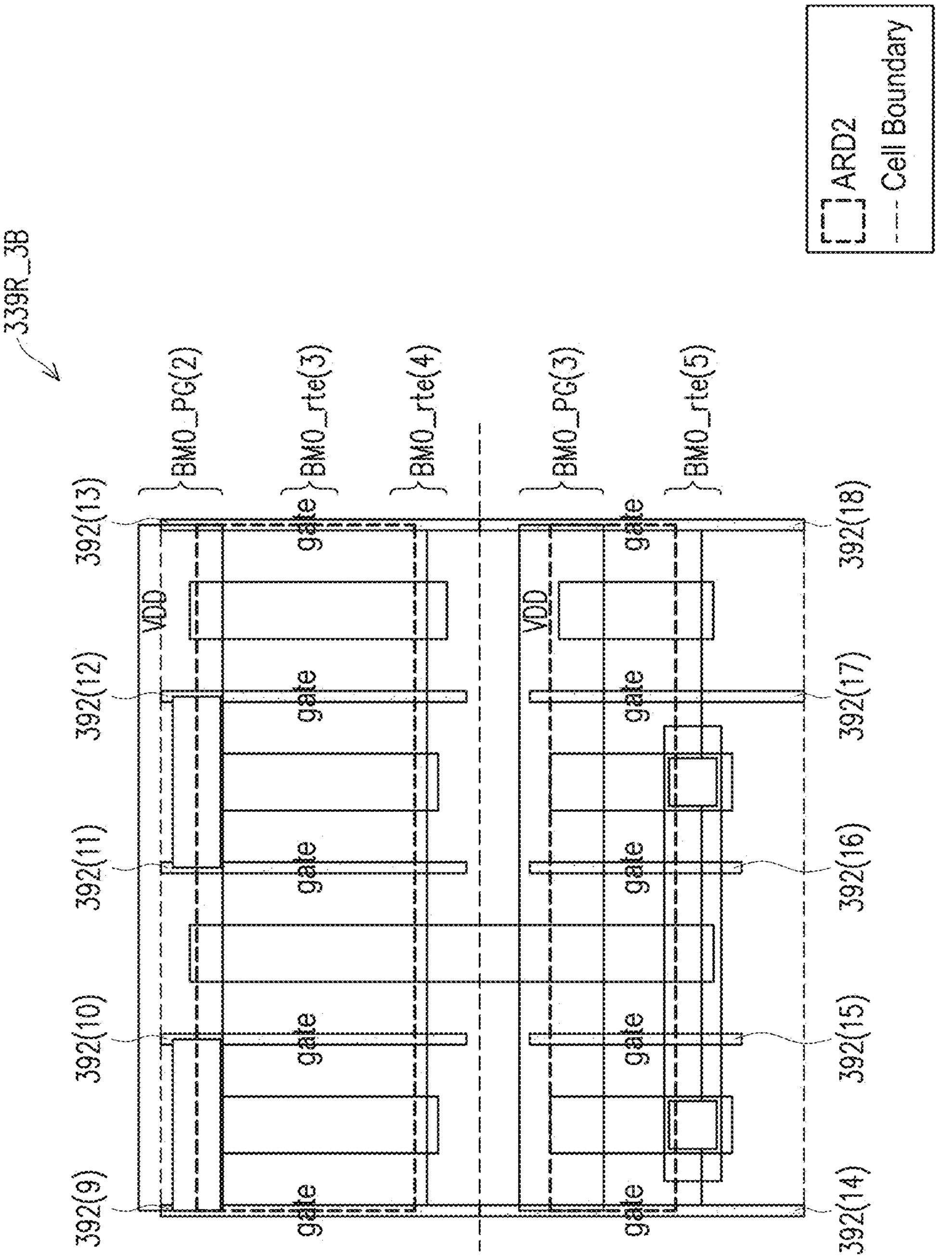
FIG. 3B
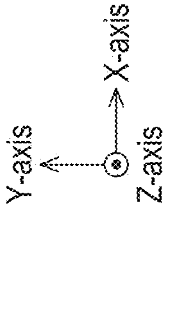
339R_3B
ARD2
Cell Boundary
BM0_PG(2)
BM0_rte(3)
BM0_rte(4)
BM0_PG(3)
BM0_rte(5)
392(13) 392(12) 392(11) 392(10) 392(9)
392(18) 392(17) 392(16) 392(15) 392(14)
VDD
VDD
gate

710A

712
Form upper active regions (ARs) correspondingly over lower ARs representing at least first and second cell regions 714
Form first conductors in 1st layer of metallization correspondingly over at least upper ARs of first and second cell regions and including M_1st_PG and M_1st_rte segments,
M_1st_rte segments in first cell region being aligned to first quantity Q1 of alpha routing tracks, and
M_1st_rte segments in second cell region being aligned to second quantity Q2 of alpha routing tracks, where Q2 < Q1

716
Form second conductors in 1st buried layer of metallization correspondingly under at least lower ARs of first and second cell regions and including BM_1st_PG and BM_1st_rte segments,
BM_1st_rte segments in first cell region being aligned to third quantity Q3 of beta routing tracks, and
BM_1st_rte segments in second cell region being aligned to fourth quantity Q4 of beta routing tracks, where Q4 < Q3

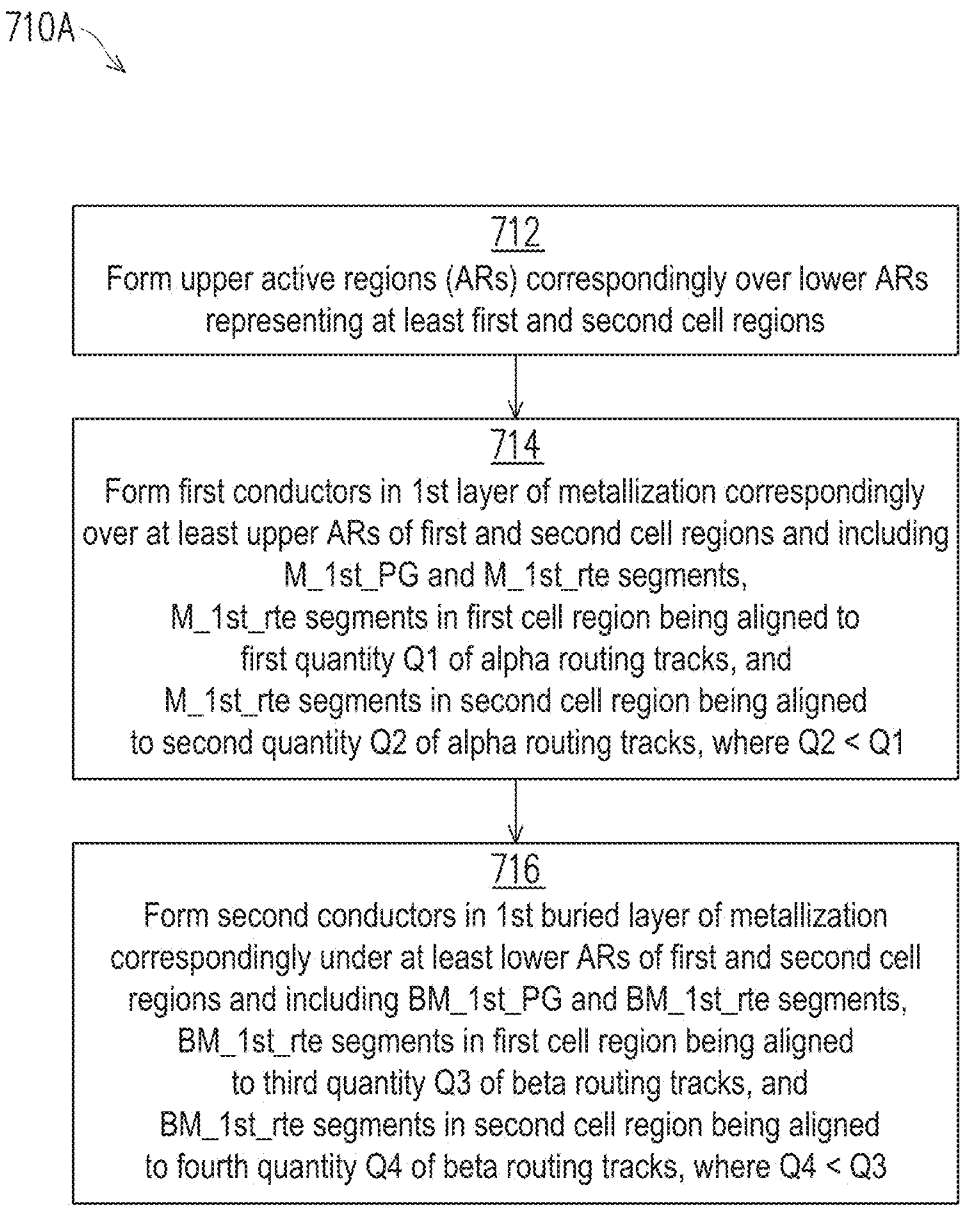

FIG. 7A

DEVICE HAVING DIFFERENT FIRST METALLIZATION LAYER AND FIRST BURIED METALLIZATION LAYER ARCHITECTURES AND METHOD OF MANUFACTURING SAME

BACKGROUND

The semiconductor integrated circuit (IC) industry produces a wide variety of analog and digital devices to address issues in a number of different areas. Developments in semiconductor process technology nodes have progressively reduced component sizes and tightened spacing resulting in progressively increased transistor density. ICs have become smaller.

BRIEF DESCRIPTION OF THE DRAWINGS

One or more embodiments are illustrated by way of example, and not by limitation, in the figures of the accompanying drawings, wherein elements having the same reference numeral designations represent like elements throughout. The drawings are not to scale, unless otherwise disclosed.

FIGS. 3A-3B and 4A-4B are corresponding layout diagrams of corresponding devices, in accordance with some embodiments.

FIGS. 6 and 7A-7B are flowcharts of corresponding methods of manufacturing a memory device, in accordance with some embodiments.

DETAILED DESCRIPTION

Figure 1A:
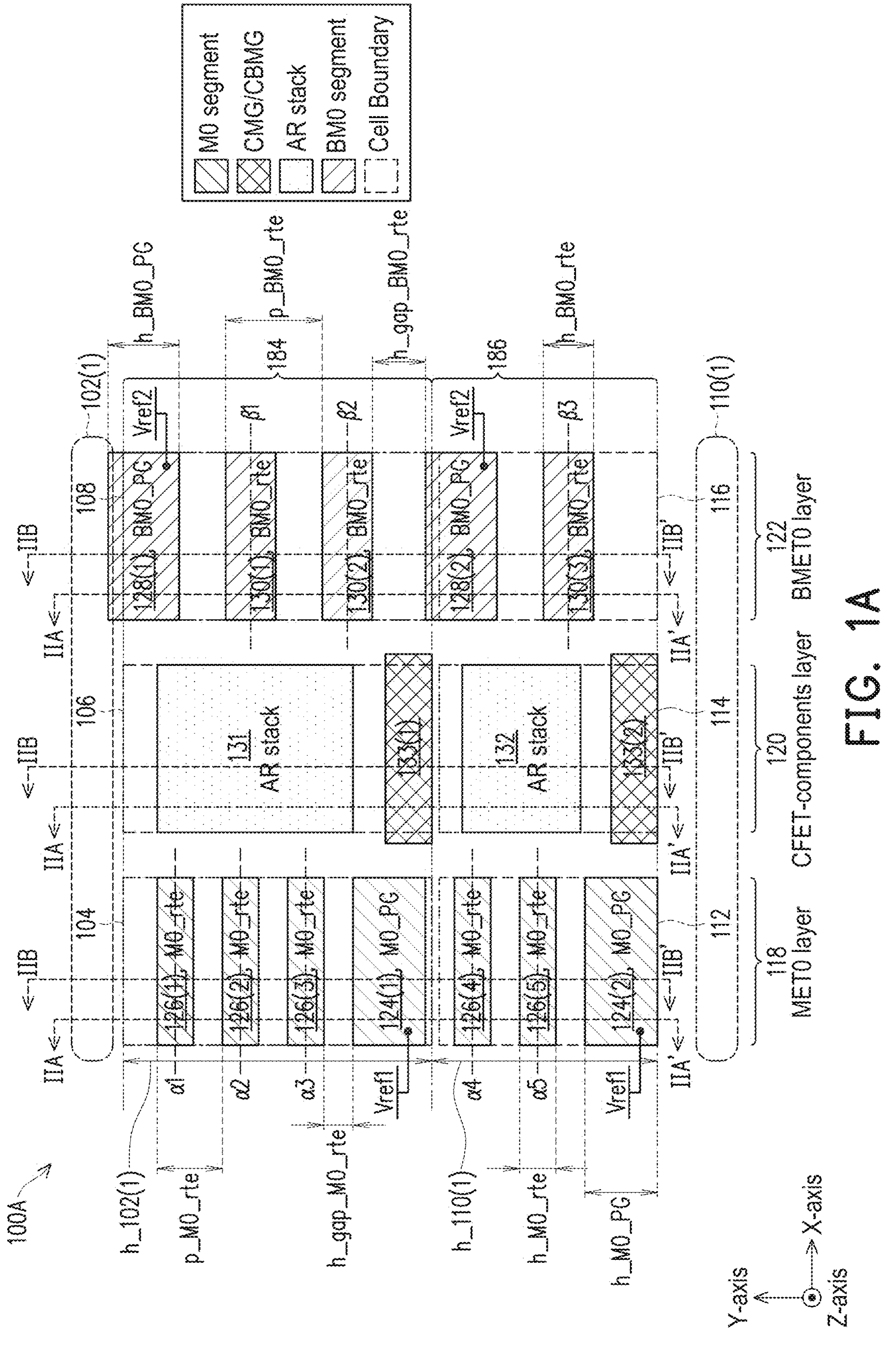
FIG. 1A is a layout diagram of a device, in accordance with some embodiments.

The following disclosure discloses many different embodiments, or examples, for implementing different features of the subject matter. Examples of components, materials, values, steps, operations, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows include embodiments in which the first and second features are formed in direct contact, and further include embodiments in which additional features are formed between the first and second features, such that the first and second features are in indirect contact. In addition, the present disclosure repeats reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, are used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus is otherwise oriented (rotated 90 degrees or at other orientations) and the spatially relative descriptors used herein are likewise interpreted accordingly. In some embodiments, the term standard cell structure refers to a standardized building block included in a library of various standard cell structures. In some embodiments, various standard cell structures are selected from a library thereof and are used as components in a layout diagram representing a circuit.

In some embodiments, a device includes: a first cell region stacked on a second cell region; each of the first and second cell regions including a first active region having a first type of dopant over a second active region having a second type of dopant different than the first type of dopant; in a first layer of metallization (M_first layer) over the first active region, M_first power grid (PG) segments having a first reference voltage and M_first routing segments aligned correspondingly to M_first routing tracks; and in a first layer of metallization (BM_first layer) under the second active region, BM_first PG segments having a second reference voltage different than the first reference voltage, and BM_first routing segments aligned correspondingly to BM_first routing tracks. The M_first routing segments are aligned in the first and second cell regions correspondingly to first (Q1) and second (Q2) quantities of the M_first routing tracks, where Q2<Q1. The BM_first routing segments are aligned in the first and second cell regions correspondingly to third (Q3) and fourth (Q4) quantities of the BM_first routing tracks, where Q4<Q3.

A second other approach mitigates a problem of a paucity of M0_rte routing resources suffered by a first other approach. The second other approach mitigates the problem by using extreme ultraviolet (EUV) lithography to form M0_rte and BM_rte segments that are shorter as compared to taller M0_rte and BM_rte segments otherwise formed by 193i lithography according to the first other approach. As parts of developing one or more of the present embodiments, the present inventors: recognized, amongst empirical data, that cell regions produced using the second other approach make inefficient use of BM_first routing segments (discussed below); recognized that if back side BM_first routing segments were used more efficiently to supplement front side M_first routing segments, then fewer BM_first routing segments would be sufficient to mitigate inadequate M_first routing resources that otherwise would be consumed according to the second other approach; recognized that BM_first routing segments having taller heights could be reintroduced because fewer BM_first routing segments would be needed due to making more efficient use of BM_first routing segments; recognized that the reintroduced BM_first routing segments having taller heights could be produced using 193i lithography, which would reduce the number of EUV lithographic masks needed otherwise according to the second other approach; recognized that reducing the number of EUV lithographic masks being used would reduce cost as compared to the second other approach; and recognized that the lower cost cell regions which had taller BM_first routing segments produced by using 193i lithographic masks, i.e., produced by using fewer EUV lithographic masks, nevertheless would produce cell regions that mitigate the second paucity of M_first routing resources at least as effectively as the second other approach.

Accordingly, at least some of the present embodiments: use back side BM_first routing segments to supplement front side M_first routing segments albeit more efficiently as compared to the second other approach, mitigate the second paucity of M_first routing resources despite using fewer BM_first routing segments as compared to the second other approach; use BM_first routing segments having taller heights as compared to the second other approach in light of fewer BM_first routing segments being needed due to making more efficient use of BM_first routing segments; use 193i lithography to produce the BM_first routing segments having taller heights which reduces the number of EUV lithographic masks otherwise needed as compared to the second other approach; reduce cost as compared to the second other approach because of using fewer EUV lithographic masks as compared to the number of EUV masks otherwise used by the second other approach; and mitigate at least one or more of the problems at least as effectively as the second other approach despite the lower cost cell regions using BM_first routing segments having taller heights as compared to the second other approach.

In some embodiments, regarding the first cell region, the third quantity of aligned BM_first routing tracks is less than the first quantity of aligned M_first routing tracks. In some embodiments, regarding the second cell region, the fourth quantity of aligned BM_first routing tracks is less than the second quantity of aligned M_first routing tracks.

In some embodiments, a cell region (of a device) includes: a first active region over a second active region; in a first layer of metallization (M_first layer) over the first active region, an M_first power grid (PG) segment configured for a first reference voltage, and M_first routing segments aligned to a first quantity of M_first routing tracks; and, in a first layer of metallization (BM_first layer) under the second active region, a BM_first PG segment configured for a second reference voltage different than the first reference voltage, and BM_first routing segments aligned to a second quantity of BM_first routing tracks, the second quantity being smaller than the first quantity.

Figure 1B:
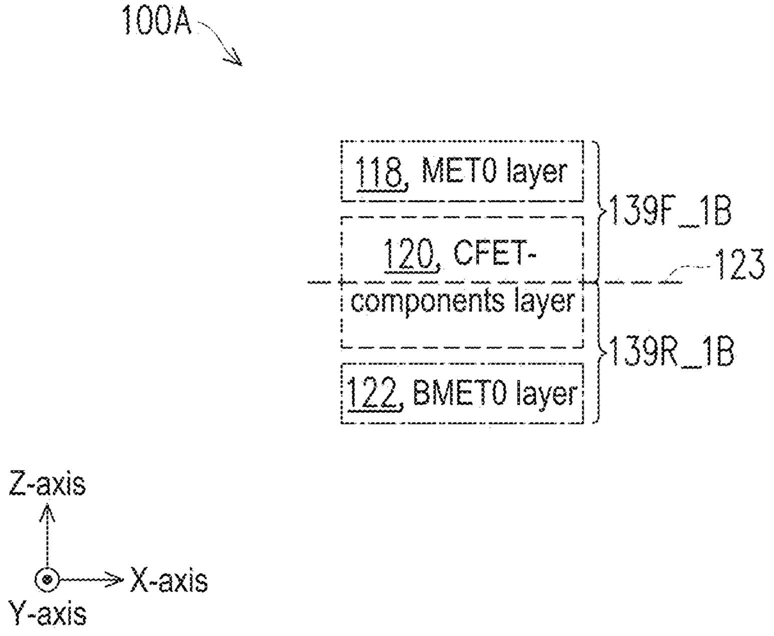
FIG. 1B is a side view of a device, in accordance with some embodiments.

FIG. 1A is a layout diagram of a device 100A, in accordance with some embodiments. FIG. 1B is a side view of device 100A, in accordance with some embodiments.

The layout diagram of FIG. 1A is representative of a device, e.g., a semiconductor device. Structures in the device are represented by patterns (also known as shapes) in the layout diagram. For simplicity of discussion, elements in the layout diagram of FIG. 1A (and also in other layout diagrams disclosed herein) will be referred to as if they are structures rather than patterns per se. For example, pattern 126(1) in FIG. 1A represents an M0 routing segment. In the following discussion, element 126(1) is referred to as M0 routing segment 126(1) rather than as M0 routing pattern 126(1).

In FIG. 1A, as well as in other layout diagrams disclosed herein, an orthogonal Cartesian coordinate system is assumed in which a first direction is parallel to the X-axis, a second direction is parallel to the Y-axis and a third direction is parallel to the Z-axis. A layout diagram per se is a top view. Shapes in the layout diagram are two-dimensional relative to, e.g., the X-axis and the Y-axis, whereas the device being represented is three-dimensional. As such, a shape in such layout diagrams is described as having a width relative to the X-axis and a height relative to the Y-axis. Relative to the Z-axis, a front side of the device being represented in the layout diagram is stacked on a back side of the device. In some embodiments, the first to third directions correspond to directions other than the X-axis, Y-axis and Z-axis.

Typically, relative to the Z-axis, the device is organized as a stack of layers in which are located corresponding structures, i.e., to which belong corresponding structures. Each shape in the layout diagram represents, more particularly, a component in a corresponding layer of the corresponding device. Also, typically, the layout diagram represents relative depth, i.e., positions along the Z-axis, of shapes and corresponding layers by superimposing a second shape on a first shape so that the second shape at least partially overlaps the first shape. Regarding some structures which are stacked in a layout diagram along the Z-axis; however, the stacking order along the Z-axis is distorted in some respects relative to the corresponding device for simplicity of illustration. Examples of the stacking order being distorted for simplicity of illustration include FIGS. 3A-3B, 4B, 4D, 5B and 5D.

In FIG. 1A, each of section line IIA-IIA' and section line IIB-IIB' extends parallel to the Y-axis. Section line IIA-IIA' corresponds to the cross-sectional view of FIG. 2A. Section line IIB-IIB' corresponds to the cross-sectional view of FIG. 2B.

Layout diagrams vary in terms of the amount of detail represented. In some circumstances, selected layers of a layout diagram are combined/abstracted into a single layer, e.g., for purposes of simplification. Alternatively, and/or additionally, in some circumstances, not all layers of the corresponding semiconductor device are represented, i.e., selected layers of the layout diagram are omitted, e.g., for simplicity of illustration. Alternatively, and/or additionally, in some circumstances, not all elements of a given depicted layer of the corresponding semiconductor device are represented, i.e., selected elements of the given depicted layer of the layout diagram are omitted, e.g., for simplicity of illustration. FIG. 1B and the other layout diagrams disclosed herein are examples of layout diagrams in which selected layers and/or selected elements of depicted given layers, have been omitted. In some embodiments, the layout diagram of FIG. 1B is part of a larger layout diagram.

Figure 2A:
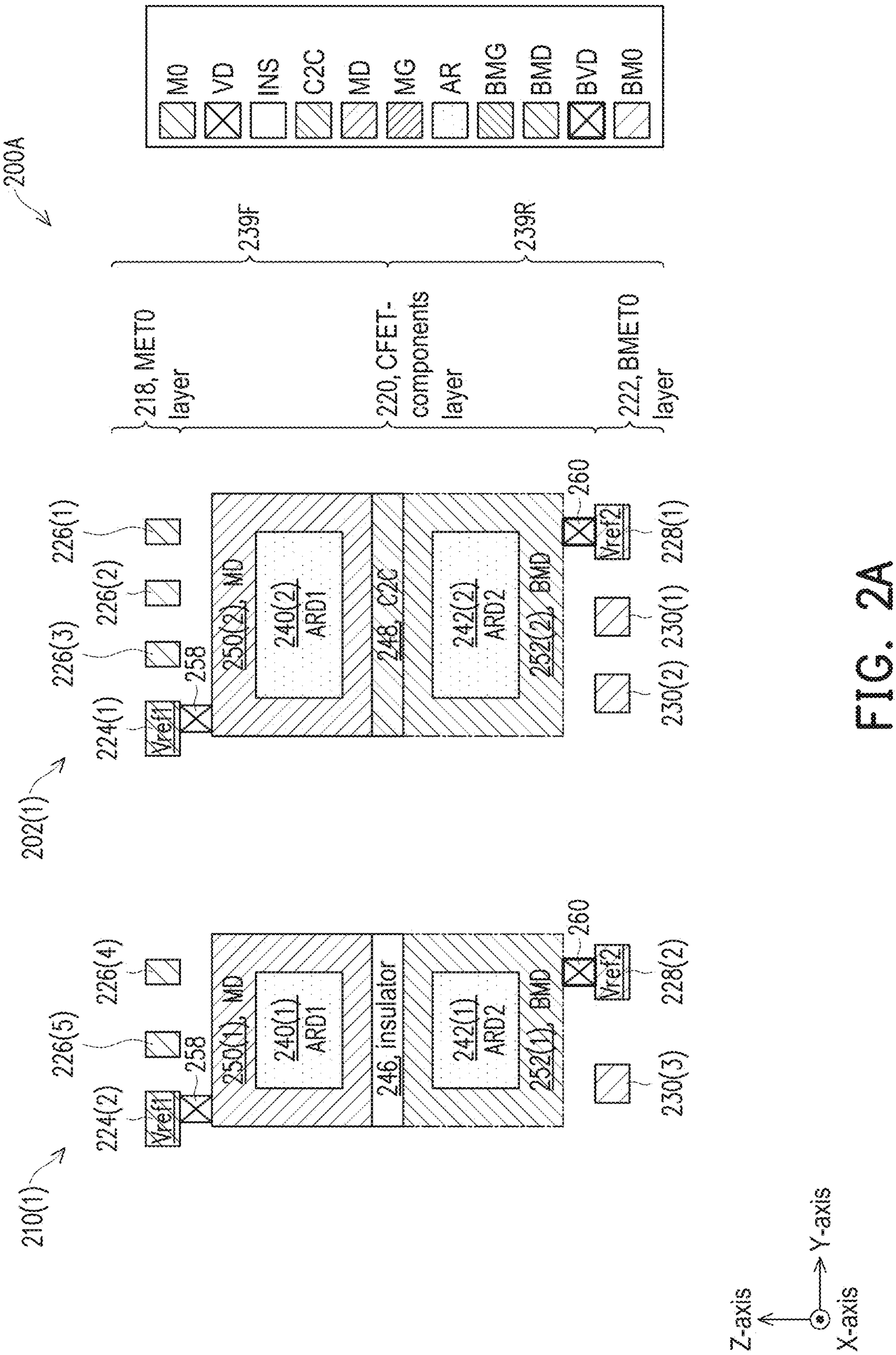
FIGS. 2A-2B are corresponding cross-sectional views of a device, in accordance with some embodiments.
Figure 2B:
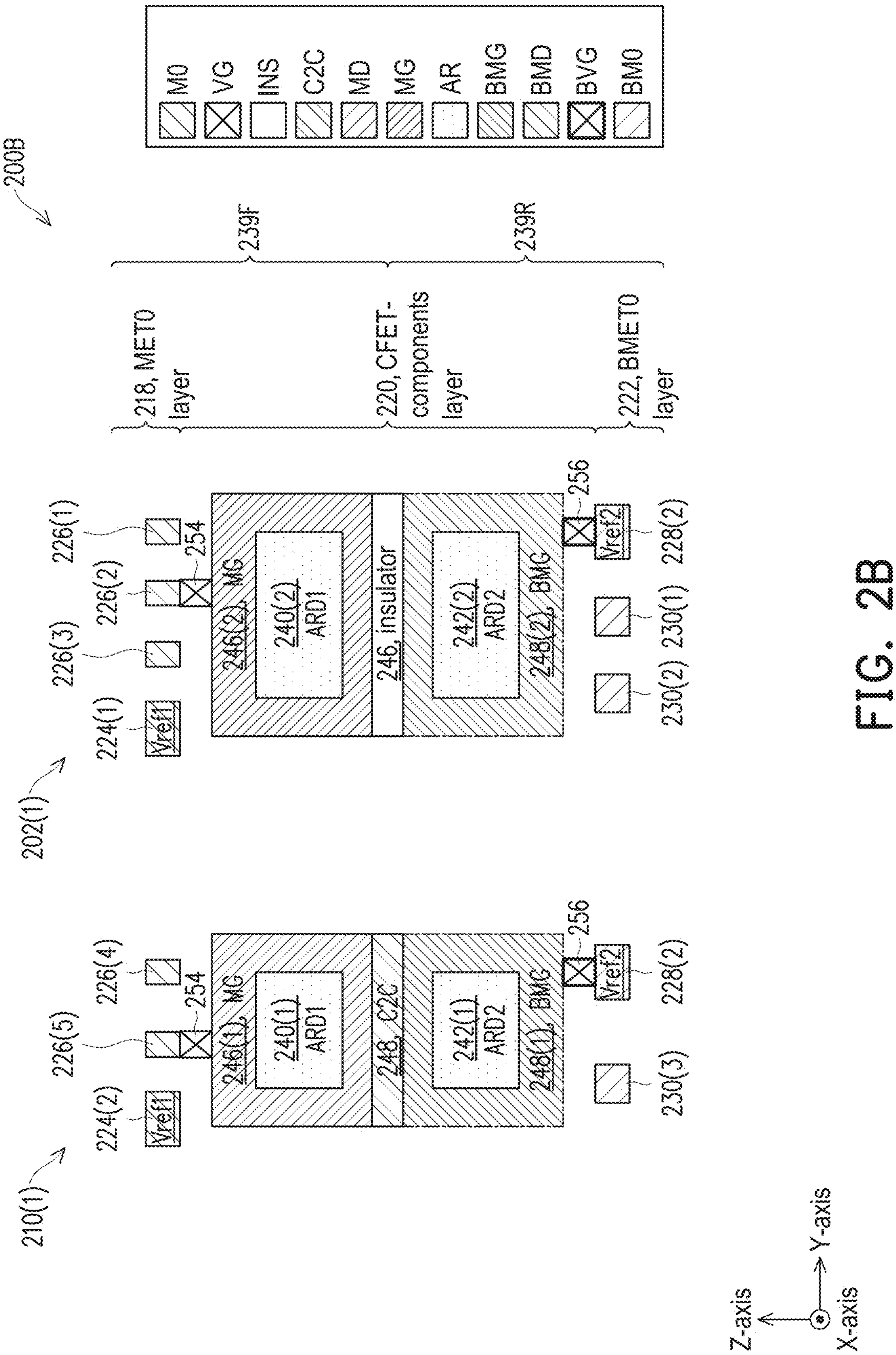
Figure 2C:
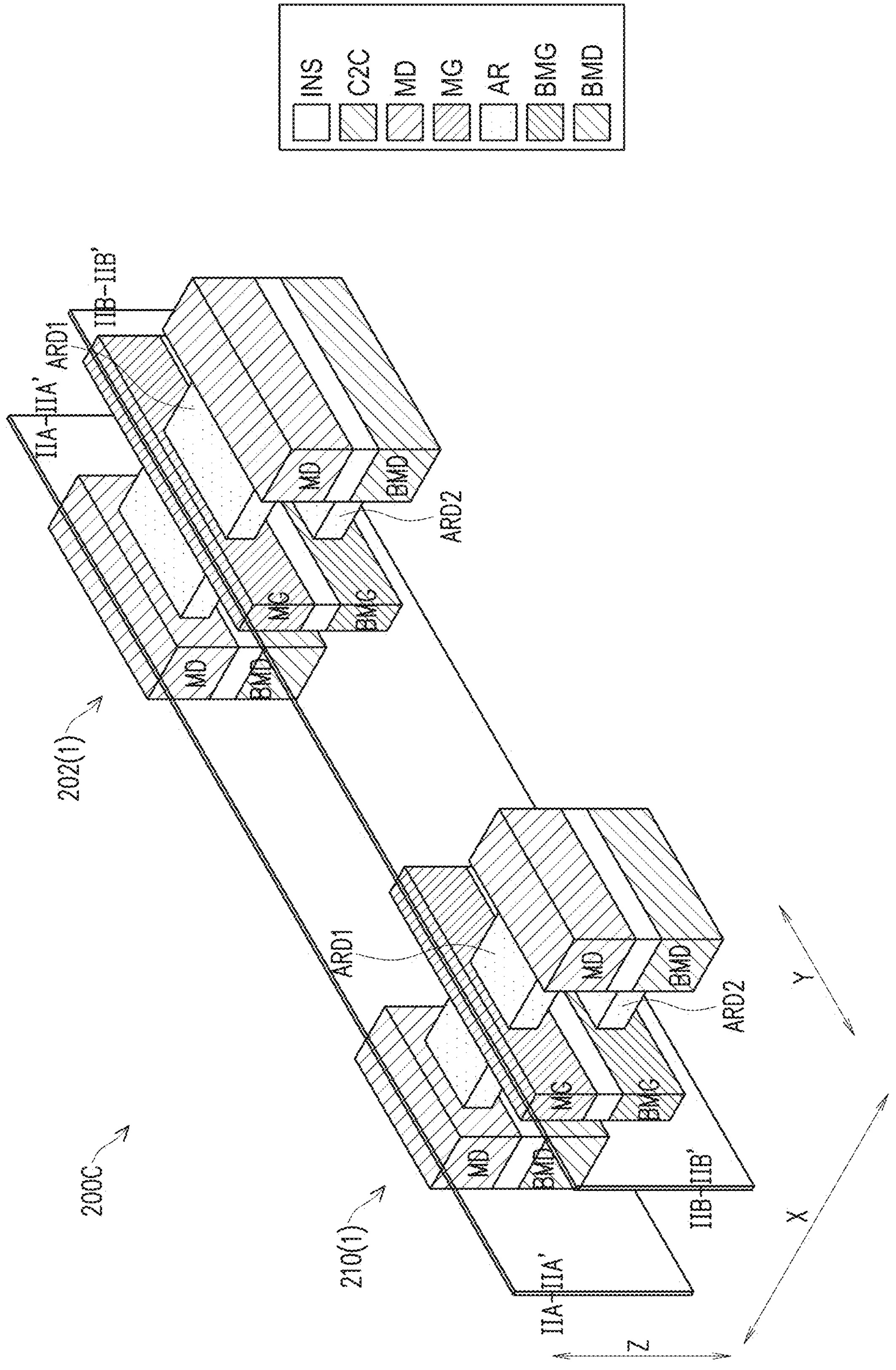
FIG. 2C is a three-quarter perspective view of a device, in accordance with some embodiments.

Device 100A is an example of a complementary field-effect transistor (CFET) architecture (FIGS. 2A-2C). To simplify representation of layers in the CFET architecture, the layout diagram of FIG. 1A is arranged into three areas 118, 120 and 122 that are separated from each other relative to a first direction which is assumed to be parallel to the X-axis. Area 120 represents a CFET-components layer in which are components of CFETs (e.g., FIGS. 2A-2B). Area 118 represents a first layer of metallization (M_first) over CFET-components layer 120. Area 122 represents a first layer of metallization (BM_first) under CFET-components layer 120. In some embodiments, the term BM_first is understood to mean 'buried M_first.'

A simple summary representation of the relationships of M_first layer 118, CFET layer 120 and BM_first layer 122 to each other relative to the Z-axis is provided by FIG. 1B. In FIG. 1B, M_first layer 118 is stacked on CFET layer 120, and CFET layer 120 is stacked on BM_first layer 122.

In FIG. 1B, a reference line 123 extending parallel to the X-axis substantially bisects CFET layer 120 of device 100A relative to the Y-axis. An area above reference line 123 is referred to as a front side 139F_1B. An area below reference line 123 is referred to as a back side (or rear side) 139R_1B.

Returning to the discussion of FIG. 1A, and more generally for the present disclosure, a numbering convention is assumed as follows: M_first layer 118 of front side 139F_1B is layer zero, i.e., the M_first layer 118 is referred to as layer MET0; a first layer of interconnection over layer MET0 is referred to as layer VIA0 (not shown); BM_first layer 122 of back side 139R_1B is referred to as layer BMET0; and a first layer of interconnection under layer BMET0 is referred to as layer BVIA0 (not shown). In some embodiments, depending upon the numbering convention of the corresponding process node by which a device is manufactured, the first layer is layer one, i.e., the first layer of metallization layer is MET1, the first layer of interconnection over layer MET1 is referred to as layer VIA1, the first layer of metallization under ARN 112(1) is referred to as layer BMET1, and the first layer of interconnection under layer BMET0 is referred to as layer BVIA1.

Device 100A includes cell regions 102(1) and 110(1). Each of cell regions 102(1) and 110(1) correspondingly has a width relative to the X-axis and a height relative to the Y-axis. The height of cell region 102(1), h_102(1), is greater than the height, h_110(1), of cell region 110(1). Relative to the Y-axis, cell region 102(1) is taller than cell region 110(1), and cell region 110(1) is shorter than cell region 102(1). As such, in some embodiments, cell region 102(1) is described as a tall cell region and cell region 110(1) is described as a short cell region. In such embodiments, tall cell region 102(1) is described as being in a tall row 184 and short cell region 110(1) is described as being a short row 186, where each of rows 184 and 186 extend parallel to the X-axis.

Cell region 102(1) includes: a portion 104 in M_first layer 118; a portion 106 in CFET layer 120; and a portion 108 in BM_first layer 122. Cell region 110(1) includes: a portion 112 in M_first layer 118; a portion 114 in CFET layer 120; and a portion 116 in BM_first layer 122.

Portion 106 of cell region 102(1) includes an active region (AR) stack 131 and a CMG/CBMG shape 133(1). In some embodiments, CMG is an acronym for cut-MG, where MG is an acronym for metal-to-gate (FIG. 2B). In some embodiments, CBMG is an acronym for cut-BMG, where BMG is an acronym for buried-metal-to-gate (FIG. 2B). Each of AR stack 131 and CMG/CBMG shape 133(1) correspondingly has a width relative to the X-axis and a height relative to the Y-axis.

Portion 114 of cell region 110(1) includes an AR stack 132 and a CMG/CBMG shape 133(2). Each of AR stack 132 and CMG/CBMG shape 133(2) correspondingly has a width relative to the X-axis and a height relative to the Y-axis. The height of AR stack 131 is greater than the height of AR stack 132.

AR stack 131 includes a front side active region ARD1 240(2) (FIGS. 2A-2B) having a first type of dopant, a back side active region ARD2 242(2) having a second type of dopant different than the first type of dopant. In some embodiments, active region ARD2 is comprised of a stack of one or more nanosheets. In some embodiments, active region ARD1 is comprised of a stack of one or more nanosheets. In some embodiments, the first type of dopant is a P-type dopant used for positive-channel metal-oxide semiconductor (PMOS) transistor technologies and the second dopant is an N-type dopant used for negative-channel metal-oxide semiconductor (NMOS) transistor technologies. In some embodiments, the first dopant type is an N-type dopant and the second dopant type is a P-type dopant.

In FIG. 1A, AR stack 131 has a height h_stk_131. AR stack 132 has a height h_stk_132. The height of AR stack 132 is smaller than the height of AR stack 131 such that h_stk_132<h_stk_131.

Portion 104 of cell 102(1) includes M0 segments 124(2), 126(4) and 126(5) in M_first layer 118 that extend parallel to the X-axis. Portion 112 of cell 110(1) includes M0 segments 124(2), 126(3), 126(4) and 126(5) in M_first layer 118 that extend parallel to the X-axis.

M0 segments 124(1) and 124(2) are parts of corresponding rails in a power grid (PG) of device 100A and are referred to as M0_PG segments 124(1) and 124(2) that are configured for carrying/conducting a first reference voltage, Vref1, which is appropriate to the first type of dopant. In some embodiments in which the first type of dopant is a P-type dopant, Vref1 is VSS. In some embodiments in which the first type of dopant is an N-type dopant, Vref1 is VDD.

M0 segments 126(1)-126(5) are routing segments that form portions of signal paths and so are configured for carrying/conducting corresponding routing signals for/of circuits implemented correspondingly by cells 102(1) and 110(1). Examples of routing signals include input/output (I/O) signals, data signals, control signals, or the like. M0 segments 126(1)-126(5) are referred to as M0_rte segments 126(1)-126(5).

MET0 layer 118 is organized according to a first grid that includes reference lines (alpha tracks) α1-α5 which extend parallel to the X-axis. M0 segments 126(1)-126(5) are aligned correspondingly to alpha tracks α1-α5. In some embodiments, M0_PG segments 124(1)-124(2) are aligned to additional instances of alpha tracks (not shown). In some embodiments, M0_PG segments 124(1)-124(2) are aligned to reference lines other than the alpha tracks.

The M0_rte segments of cell 102(1) are aligned to a number of alpha tracks, E(M0_rte_102(1)), where FIG. 1A assumes that E(M0_rte_102(1))=3. That is, M0_rte segments 126(1)-126(3) are aligned to alpha tracks α1-α3. The M0_rte segments of cell 110(1) are aligned to a number of alpha tracks, E(M0_rte_110(1)), where FIG. 1A assumes that E(M0_rte_110(1))=2. That is, M0_rte segments 126(4)-126(5) are aligned to alpha tracks α4-α5.

In some embodiments, cell 102(1) and/or cell 110(1) include a different number of M0_rte segments. In some embodiments, the M0_rte segments of cell 102(1) are aligned to a different number of alpha tracks. In some embodiments, the M0_rte segments of cell 110(1) are aligned to a different number of alpha tracks.

Portion 108 of cell 102(1) includes BM0 segments 128 (1), 130(1) and 130(2) in BM_first layer 122 that extend parallel to the X-axis. Portion 116 of cell 110(1) includes BM0 segments 128(2) and 130(3) in BM_first layer 122 that extend parallel to the X-axis.

BM0 segments 128(1) and 128(2) are parts of corresponding rails in the power grid of device 100A and are referred to as BM0_PG segments 128(1) and 128(2) that are configured for carrying/conducting a second reference voltage, Vref2, which is different than Vref1 and which is appropriate to the second type of dopant. In some embodiments in which the second type of dopant is an N-type dopant, Vref2 is VDD. In some embodiments in which the first dopant is a P-type dopant, Vref1 is VSS.

BM0 segments 130(1)-130(3) are routing segments that form portions of signal paths and so are configured for carrying/conducting corresponding I/O signals, data signals or control signals for/of circuits implemented correspondingly by cells 110(1) and 110(1). BM0 segments 130(1)-130(3) are referred to as BM0_rte segments 130(1)-130(3).

BMET0 layer 122 is organized according to a second grid that includes beta reference lines (beta tracks) β1-β3 which extend parallel to the X-axis. BM0 segments 130(1)-130(2) are aligned correspondingly to beta tracks β1-β2. In some embodiments, BM0_PG segment 128(1)-128(2) are aligned to additional instances of beta tracks (not shown). In some embodiments, BM0_PG segments 128(1)-128(2) are aligned to reference lines other than the beta tracks.

The BM0_rte segments of cell 102(1) are aligned to a number of beta tracks, Σ(BM0_rte_102(1)), where FIG. 1A assumes that Σ(BM0_rte_102(1))=2. That is, BM0_rte segments 130(1)-130(2) are aligned to beta tracks β1-β2. For cell region 102(1), the number of aligned beta tracks is smaller than the number of aligned alpha tracks such that Σ(BM0_rte_102(1))<Σ(M0_rte_102(1)). The BM0_rte segment of cell 110(1) is aligned to a number of beta tracks, Σ(BM0_rte_110(1)), where FIG. 1A assumes that Σ(BM0_rte_110(1))=1. That is, BM0_rte segment 130(3) is aligned to beta track β3. For cell region 110(1), the number of aligned beta tracks is smaller than the number of aligned alpha tracks such that Σ(BM0_rte_110(1))<E(M0_rte_110 (1)).

In some embodiments, where each of cells 102(1) and 110(1) is an example of a more general cell, the number of aligned beta tracks in the general cell is smaller than the number of aligned alpha tracks in the general cell such that Σ(grnrl_BM0_rte_110(1))<Σ(gnrl_M0_rte_110(1)).

In some embodiments, cell 102(1) and/or cell 110(1) includes a different number of BM0_rte segments. In some embodiments, the BM0_rte segments of cell 102(1) are aligned to a different number of beta tracks. In some embodiments, the BM0_rte segments of cell 110(1) are aligned to a different number of beta tracks.

In FIG. 1A, regarding MET0 layer 118, each of M0_rte segments 126(1)-126(5) has a height h_M0_rte. Relative to the Y-axis, M0_rte segments 126(1)-126(5) have a pitch p_M0_rte. Each of M0_PG segments 124(1)-124(2) has a height h_M0_PG. Each of M0_rte segments 126(1)-126(5) is separated from an adjacent M0_rte segment by a gap having a height h_gap_M0_rte such that h_gap_M0_rte=p_M0_rte−h_M0_rte. In some embodiments, each of M0_rte segments 126(1)-126(5) is separated from an adjacent M0_PG segment by a gap having height h_gap_M0_rte.

Regarding BMET0 layer 122, each of BM0_rte segments 130(1)-130(3) has a height h_BM0_rte. Relative to the Y-axis, BM0_rte segments 130(1)-130(3) have a pitch p_BM0_rte. Each of BM0_PG segments 128(1)-128(2) has a height h_BM0_PG. Each of BM0_rte segments 130(1)-130(3) is separated from an adjacent BM0_rte segment by a gap having a height h_gap_BM0_rte such that h_gap_BM0_rte=p_BM0_rte−h_BM0_rte. In some embodiments, each of BM0_rte segments 130(1)-130(3) is separated from an adjacent BM0_PG segment by a gap having height h_gap_BM0_rte.

Relative to the Y-axis: the alpha tracks have a pitch P_α, where P_α=p_M0_rte; and the beta tracks have a pitch P_β, where P_β=p_BM0_rte.

Cell 102(1) has a height h_102(1). Cell 110(1) has a height h_110(1). In some embodiments, where each of cells 102(1) and 110(1) is an example of the more general cell, the general cell has a height h_gnrl_cell=h_BM0_PG+(k*h_BM0_rte)+((k+1)*h_gap_BM0_rte), where k is a positive integer.

Regarding cell 102(1), k=2 such that cell 102(1) has a height h_102(1)=h_BM0_PG+(2*h_BM0_rte)+((2+1)*h_gap_BM0_rte). In some embodiments, the height of cell 102(1) is in a range (≈95 nm)≤h_102(1)≤(≈125 nm).

Regarding cell 110(1), k=1 such that cell 102(1) has a height h_gnrl_cell=h_BM0_PG+h_BM0_rte+((1+1)*h_gap_BM0_rte). In some embodiments, the height of cell 110(1) is in a range (≈65 nm)≤h_110(1)≤(≈87 nm).

In FIG. 1A, BM0_rte segments are taller than M0_rte segments such that h_M0_rte<h_BM0_rte. The pitch of BM0_rte segments is greater than the pitch of M0_rte segments such that p_M0_rte<p_BM0_rte. The gap-height of adjacent BM0_rte segments is greater than the gap-height of adjacent M0_rte segments such that height h_gap_M0_rte<h_gap_BM0_rte. In some embodiments, BM0_PG segments are about the same height as M0_rte segments such that h_BM0_PG≈h_M0_PG. In some embodiments, BM0_PG segments are shorter than M0_PG segments such that h_BM0_PG<h_M0_PG.

For a first given cell region that has a CFET architecture and that is oriented to an orthogonal Cartesian coordinate system similar to that assumed by present embodiments, and in a context of using 193 nm immersion (193i) lithography (also known as deep UV lithography) to form M0_rte and BM_rte segments, reductions in height (relative to the Y-axis) of the first given cell region led to fewer M0_rte segments being available which results in a first problem, i.e., a first paucity of M0_rte routing resources. A first other approach mitigates the first paucity of M0_rte routing resources by using back side BM0_rte segments to supplement front side M0_rte segments. Despite using back side BM0_rte segments to supplement front side M0_rte segments, further reductions in height (relative to the Y-axis) of the first given cell region again led to fewer M0_rte segments being available which results in a second problem, i.e., a second paucity of M0_rte routing resources.

A second other approach mitigates the second paucity of M0_rte routing resources by using extreme ultraviolet (EUV) lithography to form M0_rte and BM_rte segments rather than 193i lithography. EUV lithography is more advanced than 193i lithography, e.g., in terms of resolution, such that EUV lithography produces M0_rte and BM_rte segments that (among other things) have smaller heights relative to the Y-axis than can be produced by the 193i lithography. However, not only is EUV lithography more advanced than 193i lithography, EUV lithography is more expensive than 193i lithography.

As parts of developing one or more of the present embodiments, the present inventors: recognized, amongst empirical data, that at least about 23% of cell regions produced according to the second other approach make inefficient use of BM0_rte segments, e.g., using BM0_rte segments aligned to two beta tracks in circumstances where BM0_rte segments aligned to a single beta track otherwise would have been sufficient; recognized that if back side BM0_rte segments were used more efficiently to supplement front side M0_rte segments, then fewer BM0_rte segments would be sufficient to mitigate the second paucity of M0_rte routing resources for the at least about 23% of the cell regions in the empirical data based on the second other approach; recognized that BM0_rte segments having taller heights could be reintroduced because fewer BM0_rte segments would be needed due to making more efficient use of BM0_rte segments; recognized that the reintroduced BM0_rte segments having taller heights could be produced using 193i lithography, which would reduce the number of EUV lithographic masks needed otherwise according to the second other approach; recognized that reducing the number of EUV lithographic masks being used would reduce cost as compared to the second other approach; and recognized that the lower cost cell regions which had taller BM0_rte segments produced by using 193i lithographic masks, i.e., produced by using fewer EUV lithographic masks, nevertheless would produce cell regions that mitigate the second paucity of M0_rte routing resources at least as effectively as the second other approach.

Accordingly, at least some of the present embodiments: use back side BM0_rte segments to supplement front side M0_rte segments albeit more efficiently as compared to the second other approach, mitigate the second paucity of M0_rte routing resources despite using fewer BM0_rte segments as compared to the second other approach; use BM0_rte segments having taller heights as compared to the second other approach in light of fewer BM0_rte segments being needed due to making more efficient use of BM0_rte segments; use 193i lithography to produce the BM0_rte segments having taller heights which reduces the number of EUV lithographic masks otherwise needed as compared to the second other approach; reduce cost as compared to the second other approach because of using fewer EUV lithographic masks as compared to the number of EUV masks otherwise used by the second other approach; and mitigate the second paucity of M0_rte routing resources at least as effectively as the second other approach despite the lower cost cell regions using BM0_rte segments having taller heights as compared to the second other approach.

For a second given cell region according to the second other approach (SOA) that is a counterpart to cell region 102(1) or cell region 110(1), the second given SOA cell has two alpha tracks to which SOA_M0_rte segments are aligned and two beta tracks to which SOA_BM0_rte segments are aligned.

Whereas cell 102(1) also has three beta tracks to which BM0_rte segments are aligned, nevertheless cell 102(1) is different in that cell 102(1) has more alpha tracks, i.e., three alpha tracks, to which M0_rte segments are aligned. Whereas cell 110(1) also has two alpha tracks to which M0_rte segments are aligned, nevertheless cell 110(1) is different in that cell 110(1) has fewer beta tracks, i.e., one beta track, to which a BM0_rte segment is aligned. The counterpart AR stack of second given cell region according to the second other approach (SOA) has a height h_SOA_stk, that is shorter than AR stack 131 of cell 102(1) and taller than AR stack 132 of cell 110(1) such that h_stk_132<h_SOA_stk<h_stk_131.

In some embodiments, to photolithographically produce an instance of cell region 102(1) or an instance of cell region 110(1), one EUV mask is used to produce the BM0_rte segments and four 193i masks are used to produce the BM1_rte segments. For the second given cell region according to the second other approach (SOA) that is a counterpart to cell region 102(1) or cell region 110(1), three EUV masks are used to produce the BM0_rte segments and two EUV masks are used to produce the BM1_rte segments. Accordingly, at least some embodiments have a benefit of reducing the number of masks required by about 80%, e.g., reducing the number of EUV masks used from five to one, as compared to the second other approach, which reduces costs.

Regarding FIG. 1A, in some embodiments of the general cell, the pitch of M0_rte segments is in a range (≈20 nm)≤p_M0_rte≤(≈23 nm). In some embodiments of the general cell, the height of BM0_PG segments is in a range (≈20 nm)≤h_BM0_PG≤(≈30 nm). In some embodiments of the general cell, the height of BM0_rte segments is in a range (≈15 nm)≤h_BM0_rte≤(≈19 nm). In some embodiments of the general cell, the pitch of BM0_rte segments is in a range (≈30 nm)≤p_BM0_rte≤(≈38 nm). In some embodiments of the general cell, the gap-height adjacent to BM0_rte segments is in a range (≈15 nm)≤h_gap_BM0_rte≤(≈19 nm). In some embodiments of the general cell, a pitch of BM1 routing segments (not shown) in layer BMET1, p_BM1_rte, is in a range (≈74 nm)≤p_BM1_rte≤(≈80 nm).

For the second given cell region according to the SOA that is a counterpart to either cell region 102(1) or cell region 110(1), the counterpart cell region has: a pitch of SOA_M0_rte segments, p_SOA_M0_rte, is in a range (≈20 nm)≤p_SOA_BM0_rte≤(≈23 nm); a pitch of SOA_BM0_rte segments, p_SOA_BM0_rte, is in a range (≈20 nm)≤p_BM0_rte≤(≈23 nm); and a pitch of SOA_BM1_rte segments, p_SOA_BM1_rte, is in a range (≈42 nm)≤p_BM1_rte≤(≈48 nm).

In some embodiments, whereas the range of the front side pitch p_M0_rte of the general cell is the same as the range of the front side pitch p_SOA_M0_rte of the second given cell region according to the second other approach, the back side pitches of BM0_rte and BM1_rte of the general cell are correspondingly larger than the back side pitches of SOA_BM0_rte and SOA_BM1_rte of the second given cell region according to the second other approach. The larger back side pitches of the general cell of some embodiments facilitate using 193i lithographic masks in place of some of the EUV lithographic masks used according to the second other approach which has a benefit of reducing costs of the general cell as compared to costs of the second given cell region according to the second other approach.

Figure 1C:
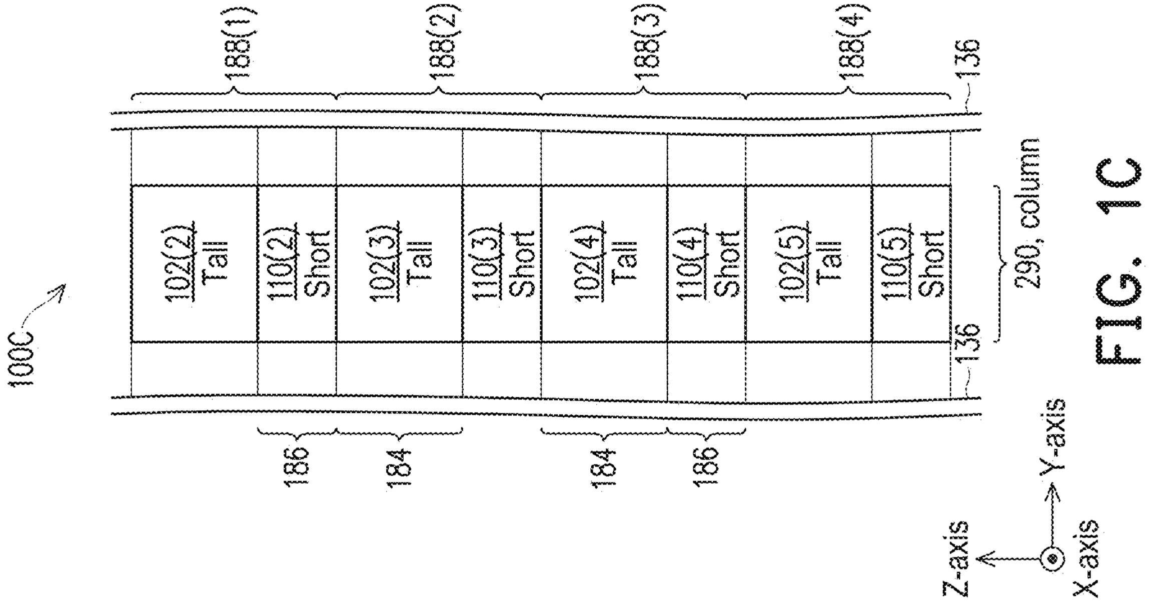
FIGS. 1C-IE are corresponding layout diagrams of corresponding devices, in accordance with some embodiments.
Figure 1D:
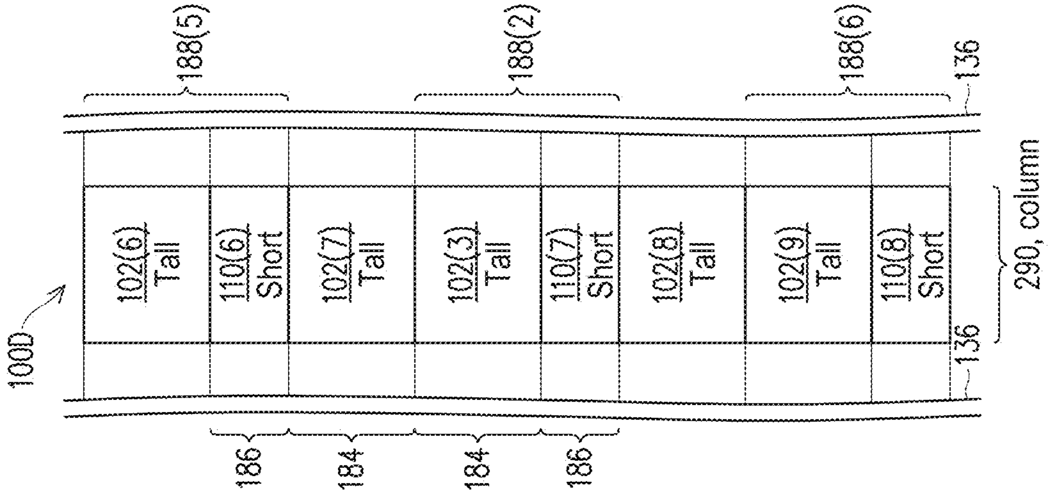
Figure 1E:
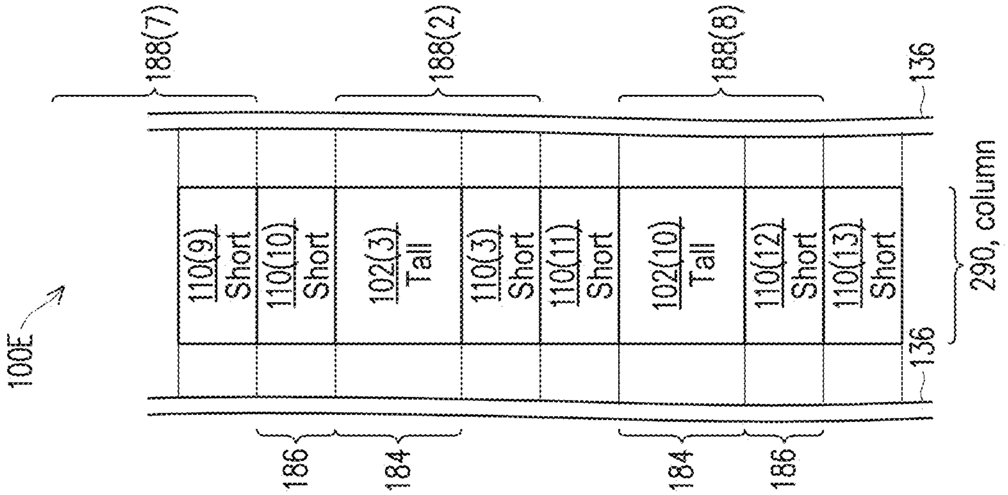

FIGS. 1C-1E are corresponding layout diagrams of corresponding devices 100C-100E, in accordance with some embodiments.

In FIGS. 1C-IE, break lines 136 indicate the following: instances of rows 184 and 186 (not all of which are called out with reference numbers) extend to the left and the right along the X-axis; and a column 290 extends upward and downward along the Y-axis.

In FIG. 1C, device 100C includes tall cell regions 102(2)-102(5) and short cell regions 110(2)-110(5) arranged in a column 290 that extends parallel to the Y-axis. Relative to the Y-axis, tall cell region 102(2) is stacked on short cell region 110(2) and together the tall and short cell regions represent a stacked pair 188(1).

Tall cell regions 102(2)-102(5) are correspondingly stacked on short cell regions 110(2)-110(5) and correspondingly represent stacked pairs 188(1)-188(4). Stacked pairs 188(1)-188(4) in column 290 are adjacent such that any two of stacked pairs 188(1)-188(4) are free from having an instance of another cell region therebetween.

In FIG. 1D, device 100D differs from device 100C of FIG. 1C as follows. Instead of tall cell regions 102(2) and 102(4)-102(5) and short cell regions 110(2) and 110(4)-110(5), device 100D further includes tall cell regions 102(6)-102(9) and short cell regions 110(6)-110(8) arranged in column 290 in addition to tall cell region 102(3) and short cell region 110(3) of stacked pair 188(2).

Tall cell regions 102(6) and 102(9) are stacked on short cell regions 110(6) and 110(8) and correspondingly represent stacked pairs 188(5)-188(6). Tall cell region 102(7) is stacked between stacked pair 188(5) and 188(2). Tall cell region 102(8) is stacked between stacked pair 188(2) and 188(6).

In FIG. 1E, device 100E differs from device 100C of FIG. 1C as follows. Instead of tall cell regions 102(2) and

102(4)-102(5) and short cell regions 110(2) and 110(4)-110(5), device 100E further includes tall cell region 102(10) and short cell regions 110(9)-110(13) arranged in column 290 in addition to tall cell region 102(3) and short cell region 110(3) of stacked pair 188(2).

Short cell region 110(9) is stacked under a tall cell region (not shown) and together represent a stacked pair 188(7). Tall cell region 102(10) is stacked on short cell region 110(12) and together represent stacked pair 188(8).

Short cell region 110(10) is stacked between stacked pair 188(7) and 188(2). Short cell region 110(11) is stacked between stacked pair 188(2) and 188(8). Short cell region 110(13) is stacked between stacked pair 188(8) and another stacked pair (not shown).

FIGS. 2A-2B are corresponding cross-sectional views 200A-200B of a device having a CFET architecture, in accordance with some embodiments. The CFET device corresponding to cross-sections 200A-200B of FIGS. 2A-2B is an example of device 100A of FIG. 1A.

FIG. 2C is a three-quarter perspective view 200C of a device having a CFET architecture, in accordance with some embodiments. CFET device 200C of FIG. 2C is a simplified version of the CFET device corresponding to cross-sections 200A-200B of FIGS. 2A-2B.

The cross-section of FIG. 2A corresponds to section IIA-IIA' of FIG. 1A. The cross-section of FIG. 2B corresponds to section IIB-IIB' of FIG. 1A. In FIGS. 2A-2C, an orthogonal Cartesian coordinate system is assumed in which a first direction is parallel to the X-axis, a second direction is parallel to the Y-axis and a third direction is parallel to the Z-axis.

Devices 200A-200B follow a similar numbering scheme to that of the layout diagrams of FIG. 1A. Though some components correspond, some components also differ. To help identify components which correspond but nevertheless have differences, the numbering convention uses 2-series numbers for cross-sections 200A-200B while FIG. 1A uses 1-series numbers. For example, M0_rte segment 226(5) in each of FIGS. 2A-2B corresponds to M0_rte segment 126(5) in FIG. 1A. For brevity, the discussion will focus more on differences between FIGS. 2A-2B and FIG. 1A than on similarities.

Relative to the Z-axis, each of devices 200A-200B: has a front side 239F and a back side 239R; and includes a CFET-components layer 220 stacked on a BMET0 layer 222, and a MET0 layer 218 stacked on CFET-components layer 220.

In FIG. 2A, cross-section 200A includes: ARD1 240(1) and ARD1 240(2); ARD2 242(1) and ARD2 242(2); in a context of source/drain (S/D) regions of ARD1 240(1) and ARD1 240(2), metal-to-MD contact structures 250(1) and 250(2); buried MD (BMD) contact structures 252(1) and 252(2); an instance of an insulator 246 between MD contact structure 250(1) and BMD contact structure 252(1); an instance of a contact-to-contact (C2C) contact structure 248 between MD contact structure 250(2) and BMD contact structure 252(2); M0_PG segments 224(1) and 224(2); M0_rte segments 226(1)-226(5); instances of a via-to-MD (VD) contact structure 258; and instances of a buried VD (BVD) contact structure 260.

Due to the instance of insulator 246, MD contact structure 250(1) is not coupled to BMD 252(1). Due to the instance of C2C contact structure 248, MD contact structure 250(2) is coupled to BMD 252(2). In some embodiments, the instance of insulator 246 between MD contact structure 250(1) and BMD 252(1) is replaced by an instance of C2C contact structure 248. In some embodiments, the instance of C2C contact structure 248 between MD contact structure 250(2) and BMD 252(2) is replaced with an instance of insulator 246.

In FIG. 2B, cross-section 200B differs from cross-section 200A of FIG. 2A as follows. Metal-to-gate (MG) contact structures 246(1) and 246(2) correspondingly replace MD contact structures 250(1) and 250(2). Buried MG (BMG) contact structures 248(1) and 248(2) correspondingly replace BMD contact structures 252(1) and 252(2). Rather than instances of VD contact structure 258, cross-section 200B includes instances of a via-to-MG (VG) contact structure 254. Rather than instances of BVD contact structure 260, cross-section 200B includes instances of a buried VG (BVG) contact structure 256.

In FIG. 2B, an instance of C2C contact structure 248 is between MG contact structure 246(1) and BMG contact structure 248(1). An instance of insulator 246 is between MG contact structure 246(2) and BMG contact structure 248(2). In some embodiments, the instance of insulator 246 between MG contact structure 246(2) and BMG contact structure 248(2) is replaced by an instance of C2C contact structure 248. In some embodiments, the instance of C2C contact structure 248 between MG contact structure 246(1) and BMG contact structure 248(1) is replaced with an instance of insulator 246.

Also as parts of developing one or more of the present embodiments, the present inventors: recognized, for the given AR stack, that use of BVG contact structure 256 results in a shorter back side ARD2 relative to a height of the front side ARD1 in order to reduce if not eliminate overlap between back side ARD2 and instances of BVG contact structure 256 relative to the Y-axis; recognized that a layout diagram of the third given cell region could be altered to reduce if not eliminate the use of the instances of BVG contact structure 256, thereby correspondingly facilitating use of the taller version of back side ARD2; recognized that using the taller version of back side ARD2 would improve performance of the third given cell region as compared to using the shorter version of back side ARD2; and recognized, more generally, that layout diagrams of third given cell regions could be altered to reduce use of instances of BVG contact structure 256, thereby facilitating use of the taller versions of back side ARD2, and correspondingly better performance of the cell regions, e.g., faster speeds. In general, benefits of reducing if not eliminating such overlap include: reducing a risk of damaging a dielectric between back side ARD2 and an instance of BMG, e.g., 248(2) due to proximity of a corresponding instance of BVG contact structure 256; reducing distortion (e.g., shifting) of a threshold voltage of transistor comprised of an instance of BVG contact structure 256 and a corresponding portion of back side ARD2 due to proximity of a corresponding instance of BVG contact structure 256; or the like.

Accordingly, at least some of the present embodiments: use BVG-reduced layout diagrams of cell regions that are arranged to reduce the use of instances of BVG contact structure 256, which correspondingly facilitates using taller versions of back side ARD2; use the taller versions of back side ARD2 in the BVG-reduced layout diagrams to improve performance of the cell regions as compared to using correspondingly shorter versions of back side ARD2 otherwise needed to reduce if not eliminate overlap between back side ARD2 and instances of BVG contact structure 256 relative to the Y-axis; and achieve better performance of the BVG-reduced cell regions, e.g., faster speeds, due to using taller versions of back side ARD2 as facilitated by reducing the use of shorter versions of back side ARD2 otherwise needed to reduce if not eliminate overlap between back side ARD2 and instances of BVG contact structure 256. FIGS. 4A-4D are examples of BVG-reduced layout diagrams which yield corresponding cell regions that exhibit speed improvements as compared to non-BVG-reduced counterpart layout diagrams.

Figure 2D:
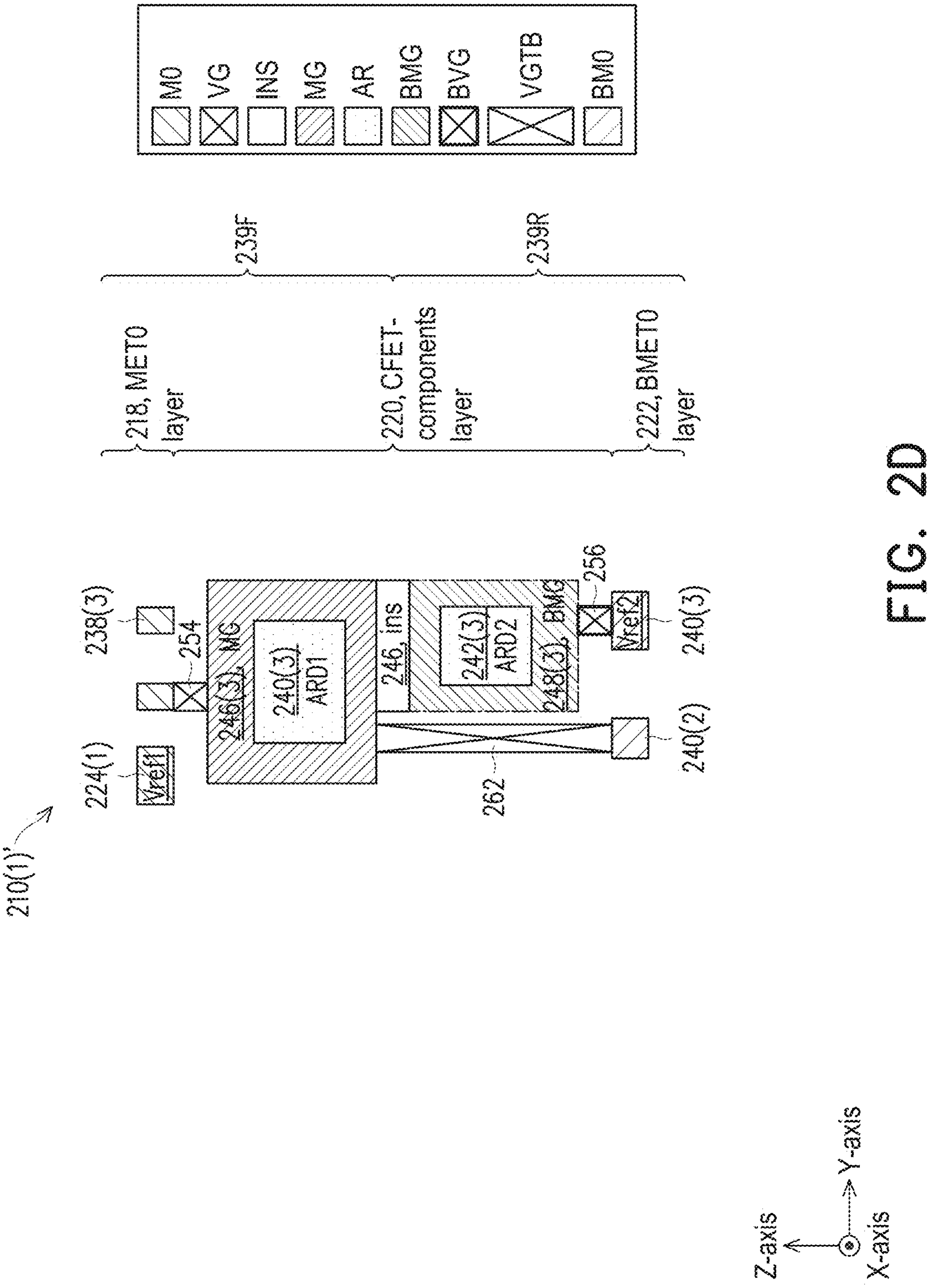
FIG. 2D is a cross-sectional view of a device, in accordance with some embodiments.

FIG. 2D is a cross-sectional view 210(1)' of a cell region having a CFET architecture, in accordance with some embodiments. The cell region corresponding to cross-section 200D of FIG. 2D is an example of cell region 110(1) of FIG. 1A. The cell region corresponding to cross-section 210(1)' of FIG. 2D is a variation of cell region 210(1) of FIGS. 2A-2B.

In FIG. 2D, cell region 210(1)' differs from cell region 210(1) of FIGS. 2A-2B as follows. ARD1 240(1) is replaced with ARD1 240(3). ARD2 242(1) is replaced with ARD2 242(3). MG contact structure 246(1) is replaced with MG contact structure 246(3). BMG contact structure 248(1) is replaced with BMG contact structure 248(3). Cell region 210(1)' includes an MG-to-BM0 (VGTB) contact structure 262 which couples an MG contact structure 246(3) to BM0_rte segment 240(2).

For a given AR stack in a third given cell region that has a CFET architecture and that is oriented to an orthogonal Cartesian coordinate system similar to that assumed by present embodiments, an MG-to-BM0 (VGTB) contact structure (in some embodiments) is used to couple a front side active region ARD1 to a corresponding BM0_rte segment. An example of a VGTB contact structure is element 262 of FIG. 2D, where VGTB contact structure 262 couples an MG contact structure 246(3) to BM0_rte segment 240(2).

Also as parts of developing one or more of the present embodiments, the present inventors: recognized, for the given AR stack, that use of instances of VGTB contact structure 262 results in a shorter back side ARD2 relative to a height of the front side ARD1 in order to provide clearance for VGTB contact structure 262 to extend through a portion of a layer occupied otherwise by version of back side ARD2 which is as tall as the front side ARD1; recognized that a layout diagram of the third given cell region could be altered to reduce if not eliminate the use of instances of VGTB contact structure 262, thereby correspondingly facilitating use of the taller version of back side ARD2; recognized that using the taller version of back side ARD2 would improve performance of the third given cell region as compared to using the shorter version of back side ARD2; and recognized, more generally, that layout diagrams of third given cell regions could be altered to reduce use of instances of VGTB contact structure 262, thereby facilitating use of the taller versions of back side ARD2, and correspondingly better performance of the cell regions, e.g., faster speeds.

Accordingly, at least some of the present embodiments: use VGTB-reduced layout diagrams of cell regions that are arranged to reduce the use of instances of VGTB contact structure 262, which correspondingly facilitates using taller versions of back side ARD2; use the taller versions of back side ARD2 in the VGTB-reduced layout diagrams to improve performance of the cell regions as compared to using correspondingly shorter versions of back side ARD2 otherwise needed to accommodate instances of VGTB contact structure 262; and achieve better performance of the VGTB-reduced cell regions, e.g., faster speeds, due to using taller versions of back side ARD2 as facilitated by reducing the use of shorter versions of back side ARD2 otherwise needed to accommodate instances of VGTB contact structure 262. FIGS. 4A-4D are examples of VGTB-reduced layout diagrams which yield corresponding cell regions that exhibit speed improvements as compared to non-VGTB-reduced counterpart layout diagrams.

Figure 3A:
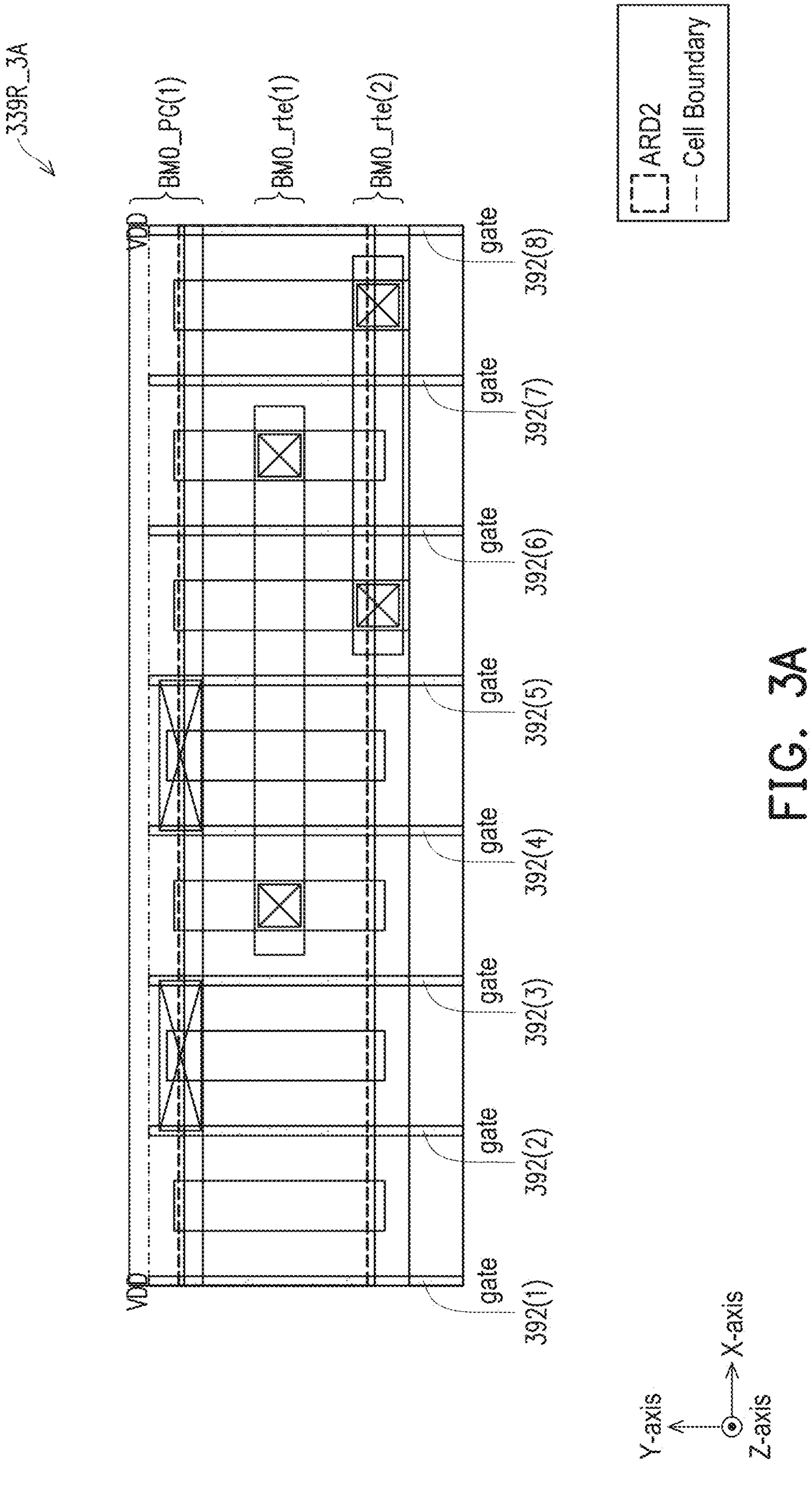

FIGS. 3A-3B are corresponding back side layout diagrams 339R_3A and 339R_3B of an AO22D1 cell region, in accordance with some embodiments.

In some embodiments, AOD22D1 is an alphanumeric text string used as an adjective that is intended to connote that the cell region having back side layout diagram 339R_3A is an AND-OR cell region for which the AND gate portion has two inputs, the OR gate has two inputs and the driving strength of the cell region is a unit driving strength D. In some embodiments, a value of unit driving strength D is determined by, e.g., the design rules and scale of the corresponding semiconductor process technology node.

The AO22D1 cell region having back side layout diagram 339R_3A has an arrangement similar to cell region 102(1).

In FIG. 3A, layout diagram 339R_3A includes: a single instance of ARD2; a BM0_PG segment BM0_PG(1); BM0_rte segments BM0_rte(1)-BM0_rte(2); and buried gate lines 392(1)-392(8).

Relative to the X-axis, adjacent ones of buried gate lines 392(1)-392(8) are separated by a uniform distance. In some embodiments, the uniform distance is a multiple of a given unit of distance-measure. In some embodiments, the value of the multiple is one such that the uniform distance is one instance of the given unit of distance-measure. In some embodiments, the unit of distance-measure is 1.0 CPP. In some embodiments, CCP is an acronym for contacted poly pitch. A value for CPP is determined, e.g., by the design rules and scale of the corresponding semiconductor process technology node. Here, the word 'poly' in the term CPP does not necessarily imply that the gate lines in semiconductor devices based correspondingly on FIG. 3A are to be formed of polysilicon but instead represents a historical convenience—gate structures in ICs manufactured according to one or more predecessor semiconductor process technology nodes often were formed of polysilicon which lead to the term 'poly' being used colloquially to mean 'gate line.'

In FIG. 3A, the AO22D1 cell region corresponding to back side layout diagram 339R_3A has a width of 7 CPP. The AO22D1 cell region corresponding to back side layout diagram 339R_3A has height h_102(1).

For a fourth given cell region according to the SOA that is a counterpart to the AO22D1 cell region corresponding to back side layout diagram 339R_3A, the fourth given cell region includes one instance of a BVG contact structure, which reduces the height of the counterpart back side ARD2 in the fourth given cell region. A benefit of the AO22D1 cell region corresponding to back side layout diagram 339R_3A (and also the AO22D1 cell region corresponding to back side layout diagram 339R_3B, discussed below) is that instances of a BVG contact structure are avoided such that back side ARD2 in the AO22D1 cell region corresponding to back side layout diagram 339R_3A is taller than the counterpart back side ARD2 in the fourth given cell region according to the SOA.

Back side layout diagram 339R_3A is an example of a VGTB-reduced layout diagram that uses at least one taller version of back side ARD2. In some embodiments of an AO22D1 cell region corresponding in part to back side layout diagram 339R_3A, the use of the at least one taller version of back side ARD2 in the VGTB-reduced layout diagram yields corresponding cell regions that exhibit speed improvements of about 35% as compared to non-VGTB-reduced counterpart layout diagrams.

In some embodiments, gate lines 392(1) and 392(8) are replaced by corresponding isolation dummy gates (IDGs)

(discussed below). In some embodiments, gate line 392(5) is replaced by an IDG. In some embodiments in which gate line 392(5) is replaced by an IDG (IDG 392(5)), the AO22D1 cell region having back side layout diagram 339R_3A is described as a combination of a first cell region to the left of IDG 392(5) and a second cell region to the right of IDG 392(5).

In some embodiments, an IDG is a dielectric structure that includes one or more dielectric materials and functions as an electrical isolation structure. Accordingly, an IDG is not a structure that is electrically conductive and thus does not function, e.g., as an active gate of a transistor. An IDG includes one or more dielectric materials and functions as an electrical isolation structure. In some embodiments, an IDG is based on an MD contact structure or a BMD contact structure as a precursor. In some embodiments, a method of forming an IDG includes: forming an MD or BMD contact structure; sacrificing/removing (e.g., etching) the MD or BMD contact structure to form a trench around the corresponding ARP or ARN; (optionally) removing a portion or all of the corresponding ARP or ARN that previously had been partially or completely surrounded by MD or BMD contact structure to deepen the trench and thereby partially or completely divide the corresponding ARP or ARN from extending beyond/outside the corresponding left or right side of cell region relative to the X-axis; and then filling the trench with one or more dielectric materials such that the physical dimensions of the resultant electrical isolation structure, i.e., the IDG, are similar to the dimensions of the MD or BMD contact structure which was sacrificed. In some embodiments, an IDG is a dielectric feature that includes one or more dielectric materials (e.g., oxide, nitride, oxynitride, or other suitable materials), and functions as an isolation feature. In some embodiments, an IDG is a type of continuous polysilicon on oxide diffusion (OD) edge structure and is referred to as a type of CPODE structure.

Regarding FIG. 3B, and relative to a cell boundary extending parallel to the X-axis, the AO22D1 cell region having back side layout diagram 339R_3B is arranged into a third cell region above the cell boundary and a fourth cell region below the cell boundary. The third cell region has an arrangement similar to cell region 102(1). The fourth cell region has an arrangement similar to cell region 110(1). Each of the third cell region and the fourth cell region has a width of 4 CPP. The third cell region has a height h_102(1). The fourth cell region has height h_110(1). Together, the third and fourth cell regions are an example of stacked pair, e.g., stacked pair 188(2).

In FIG. 3B, the AO22D1 cell region corresponding to back side layout diagram 339R_3B has a width of 4 CPP. The AO22D1 cell region corresponding to back side layout diagram 339R_3A has height h_102(1)+h_110(1). As compared to the AO22D1 cell region corresponding to back side layout diagram 339R_3A, the AO22D1 cell region corresponding to back side layout diagram 339R_3B is taller but narrower, i.e., has a smaller width.

In FIG. 3B, layout diagram 339R_3B includes: first and second instances of ARD2 correspondingly in the third and fourth cell regions; BM0_PG segments BM0_PG(2)-BM0_PG(3); BM0_rte segments BM0_rte(3)-BM0_rte(5); buried gate lines 392(9)-392(13) in the third cell region; and buried gate lines 392(14)-392(18) in the fourth cell region. Buried gate lines 392(9)-392(13) are substantially collinear correspondingly with buried gate lines 392(14)-392(18). In some embodiments, buried gate lines 392(9), 392(13), 392 (14 and 392(18) are replaced by corresponding IDGs.

The first instance of ARD2 in the third cell region of FIG. 3B is taller than the counterpart back side ARD2 in the fourth given cell region according to the second other approach. In some embodiments, the second instance of ARD2 in the fourth cell region of FIG. 3B is substantially the same height as the counterpart back side ARD2 in the fourth given cell region according to the second other approach.

Back side layout diagram 339R_3B is another example of a VGTB-reduced layout diagram that uses at least one taller version of back side ARD2. In some embodiments of an AO22D1 cell region corresponding in part to back side layout diagram 339R_3B, the use of the at least one taller version of back side ARD2 in the VGTB-reduced layout diagram yields corresponding cell regions that exhibit speed improvements of about 34% as compared to non-VGTB-reduced counterpart layout diagrams.

Figure 4A:
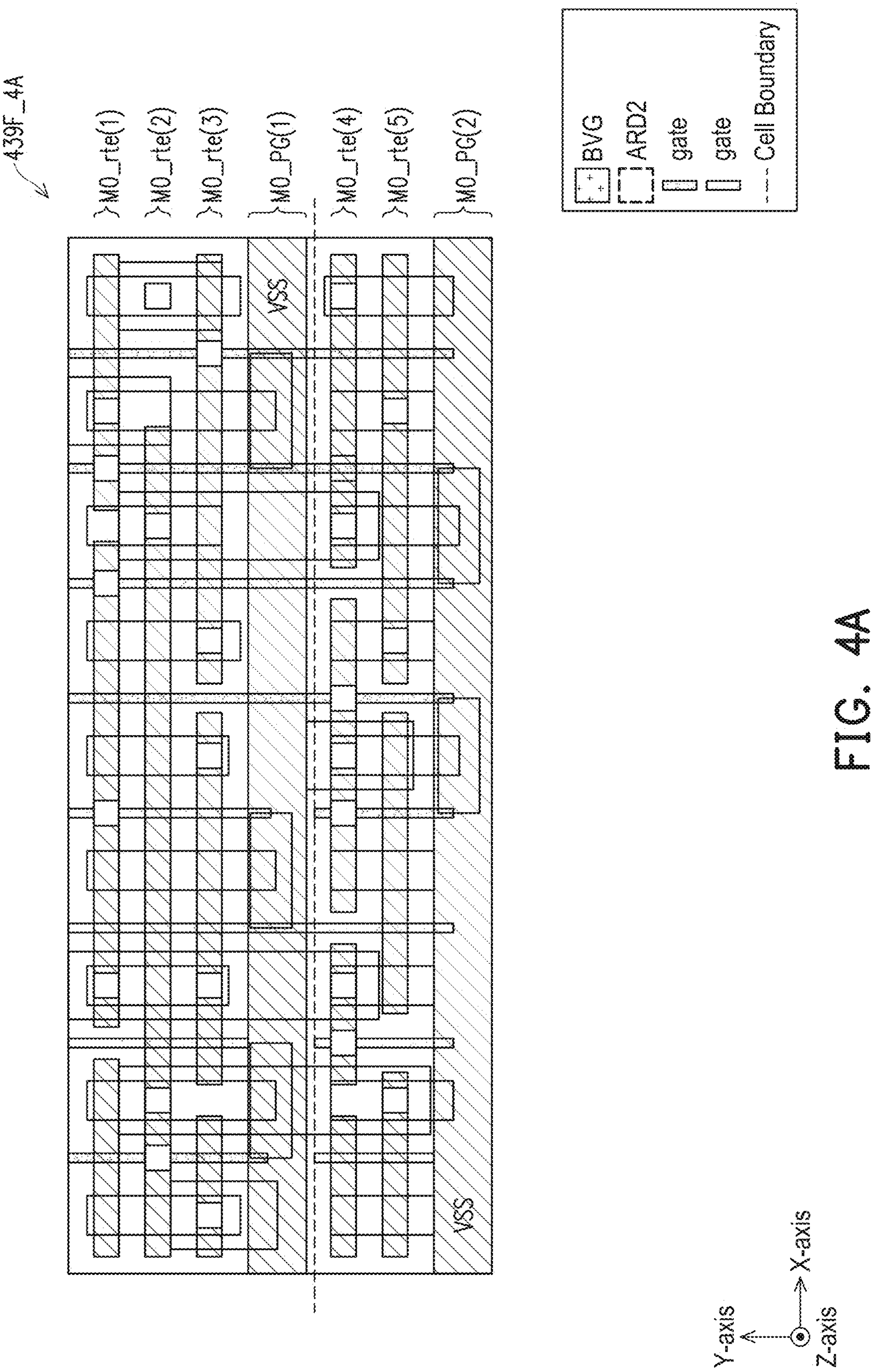
Figure 4B:
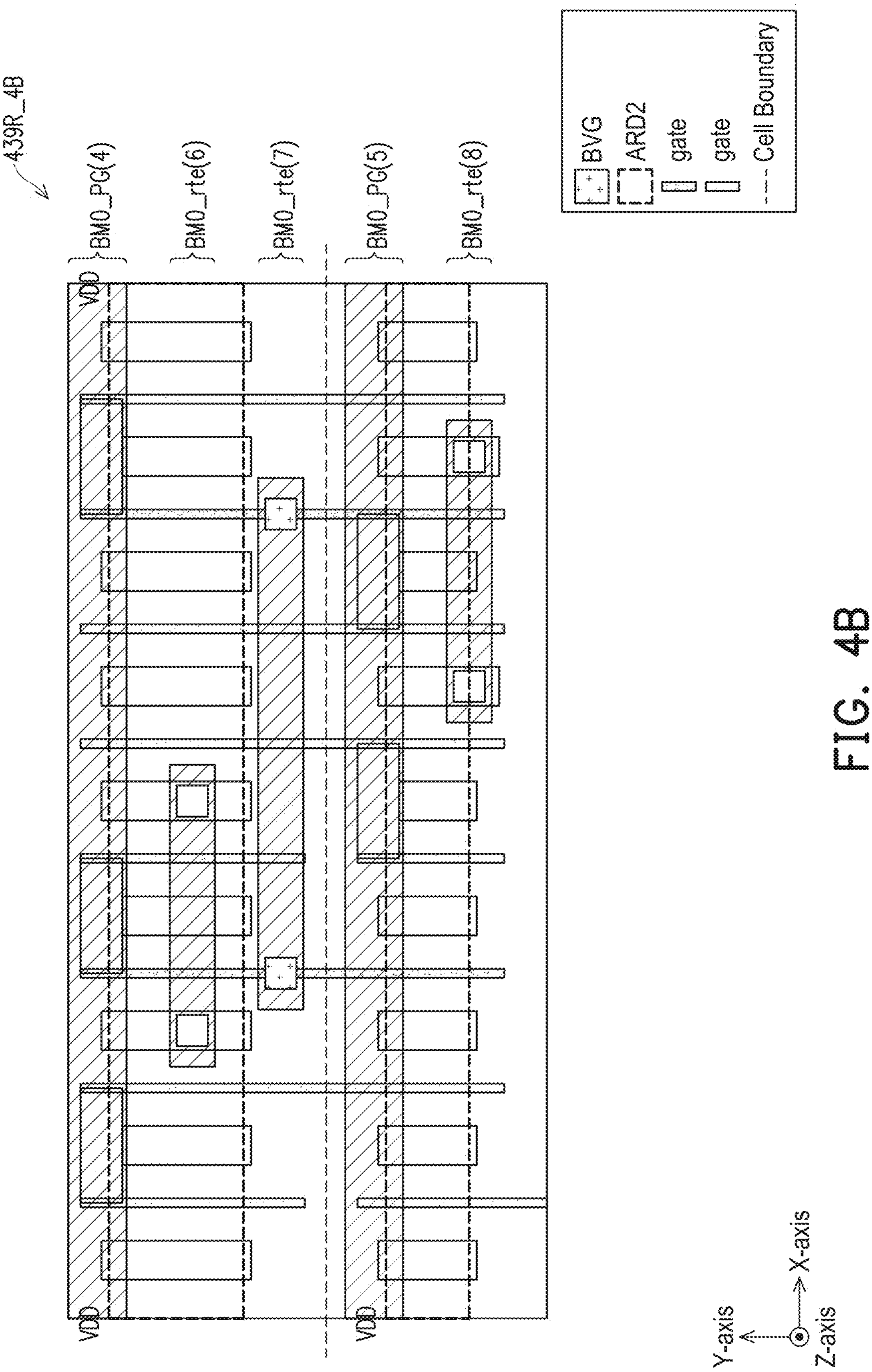

FIGS. 4A-4B are corresponding front side 439F_4A and back side 439_4B layout diagrams of an FAD1 cell region, in accordance with some embodiments.

In some embodiments, FAD1 is an alphanumeric text string used as an adjective that is intended to connote that the cell region having front side layout diagram 439F_4A and back side layout diagram 439R_4B is a one-bit (single bit) full adder (FA) for which the driving strength of the cell region is D1.

Regarding each of FIGS. 4A-4B, and relative to a cell boundary extending parallel to the X-axis, the FAD1 cell region having front side layout diagram 439F_4A and back side layout diagram 439R_4B is arranged into a fifth cell region above the cell boundary and a sixth cell region below the cell boundary. The fifth cell region has an arrangement similar to cell region 102(1). The sixth cell region has an arrangement similar to cell region 110(1). Each of the fifth cell region and the sixth cell region has a width of 9 CPP. The fifth cell region has a height h_102(1). The sixth cell region has height h_110(1). Together, the fifth and sixth cell regions are an example of stacked pair, e.g., stacked pair 188(2).

In FIG. 4A, layout diagram 4A 439F_4A includes: a first instance (not shown) of ARD1 in the fifth cell region and a second instance (not shown) of ARD1 in the sixth cell region; M0_PG segments M0_PG(1) and M0_PG(2) correspondingly in the fifth and sixth cell regions; M0_rte segments M0_rte(1)-M0_rte(5) correspondingly in the fifth and sixth cell regions; and gate lines correspondingly in the fifth and/or sixth cell regions. In some embodiments, the leftmost gate line and the rightmost gate line of the fifth cell region are replaced by corresponding IDGs. In some embodiments, the leftmost gate line and the rightmost gate line of the sixth cell region are replaced by corresponding IDGs.

In FIG. 4B, layout diagram 439R_4B includes: a first instance of ARD2 in the fifth cell region and a second instance of ARD2 in the sixth cell region; BM0_PG segments BM0_PG(4) and BM0_PG(5) correspondingly in the fifth and sixth cell regions; BM0_rte segments BM0_rte(6)-BM0_rte(8) correspondingly in the fifth and sixth cell regions; buried gate lines correspondingly in the fifth and/or sixth cell region; and two instances of a BVG contact structure coupled to BM0_rte segment BM0_rte(7). In some embodiments, the leftmost buried gate line and the rightmost buried gate line of the fifth cell region are replaced by corresponding IDGs. In some embodiments, the leftmost buried gate line and the rightmost buried gate line of the sixth cell region are replaced by corresponding IDGs.

A fifth given cell region according to the second other approach that is a counterpart to the FAD1 cell region corresponding to front side layout diagram 439F_4A and back side layout diagram 439R_4B is represented by three instances of a sixth given cell region according to the second other approach that are stacked on each other. The back side of each of the three instances of the sixth given cell region has BM0_rte segments aligned to two beta tracks, i.e., two aligned beta tracks per instance of the sixth cell region. The fifth given cell region includes three counterpart instances of ARD2 and five instances of a BVG contact structure, which reduce the corresponding heights of the three counterpart instances of back side ARD2 in the fifth given cell region. A benefit of the FAD1 cell region corresponding to front side layout diagram 439F_4A and back side layout diagram 439R_4B is that four instances of a BVG contact structure are avoided which facilitates at least the first instance of ARD2 in the fifth cell region being taller than each of the three counterpart instances of back side ARD2 in the fifth given cell region according to the second other approach. In some embodiments, the second instance of ARD2 in the sixth cell region of FIG. 4B is shorter than the counterpart back side ARD2 in each of the three instances of the sixth given cell region according to the second other approach.

The three instances of the sixth given cell region according to the second other approach have an average of 2.0 aligned beta tracks per cell region. The fifth and sixth cell regions of FIG. 4B correspondingly have BM0_rte segments aligned correspondingly to two beta tracks and one beta track. Taken together, the fifth and sixth cell regions of FIGS. 4A-4B have an average of 2.5 aligned beta tracks per cell region which represents at least an improvement in routing resources as compared to the fifth given cell region according to the second other approach.

Back side layout diagram 439R_4B is an example of a VGTB-reduced layout diagram that uses at least one taller version of back side ARD2. In some embodiments of the FAD1 cell region corresponding to front side layout diagram 439F_4A and back side layout diagram 439R_4B, the use of the at least one taller version of back side ARD2 in the VGTB-reduced layout diagram yields corresponding cell regions that exhibit speed improvements of about 12% as compared to non-VGTB-reduced counterpart layout diagrams.

Figure 4C:
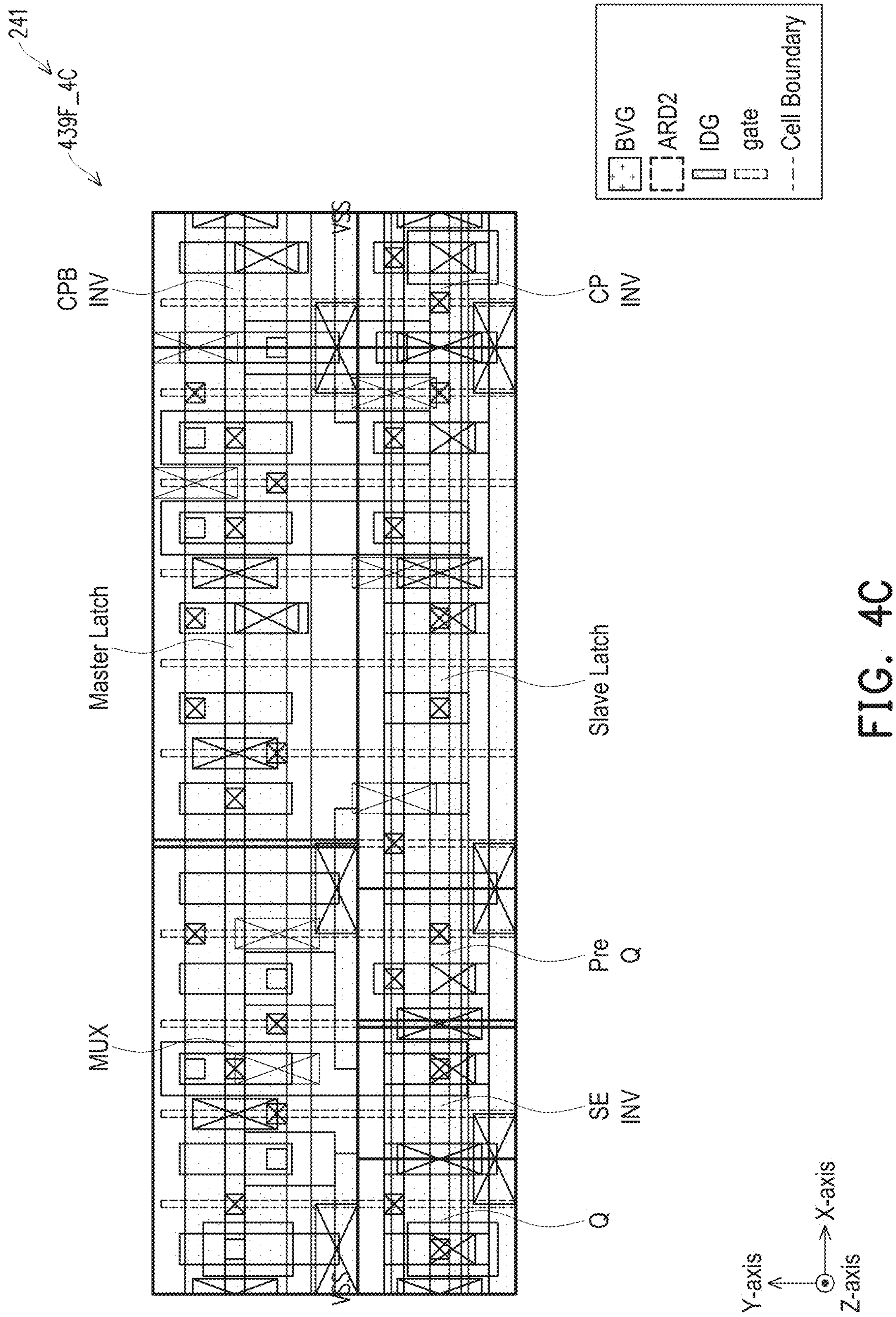
FIGS. 4C-4D are correspondingly a floorplan and a layout diagram of a device, in accordance with some embodiments.
Figure 4D:
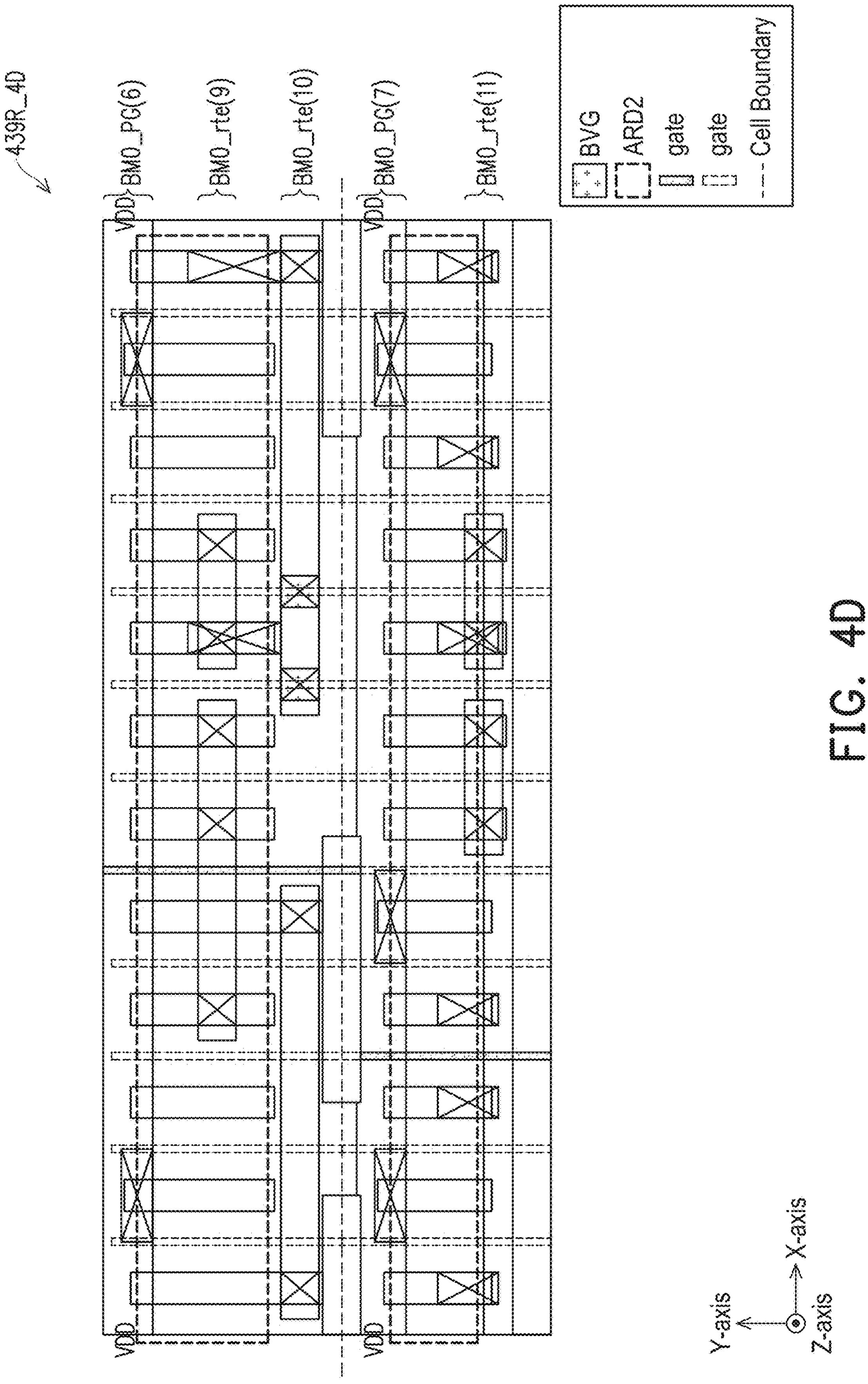

FIGS. 4C-4D are correspondingly a floorplan 241 and a back side layout diagram 439R_4D of an SDFQD1, in accordance with some embodiments. FIG. 4C also includes a front side layout diagram 439F_4C which lies underneath floorplan 241, in accordance with some embodiments.

In some embodiments, SDFQD1 is an alphanumeric text string used as an adjective that is intended to connote that the cell region having floorplan 241 and back side layout diagram 439R_4D is a scan-insertion D FF (SDFQ) for which the driving strength of the cell region is D1.

In FIG. 4C, floorplan 241 shows that the SDFQD1 cell region includes: a clock pulse (CP) inverter CP INV that generates an inverted version of CP (CPB); a CPB inverter CPB INV that generates an inverted version of CPB; a scan enable (SE) signal inverter SE INV that generates an inverted version of SE (SEB); a multiplexer MUX; a master latch; a slave latch; and an output buffer that includes blocks Q and Pre Q.

Regarding each of FIGS. 4C-4D, and relative to a cell boundary extending parallel to the X-axis, the SDFQD1 cell region having floorplan 241, front side layout diagram 439F_4C and back side layout diagram 439R_4D is arranged into a seventh cell region above the cell boundary and an eighth cell region below the cell boundary. The seventh cell region has an arrangement similar to cell region 102(1). The eighth cell region has an arrangement similar to cell region 110(1). Each of the seventh cell region and the eighth cell region has a width of 12 CPP. The seventh cell region has a height h_102(1). The eighth cell region has height h_110(1). Together, the seventh and eighth cell regions are an example of stacked pair, e.g., stacked pair 188(2).

In FIG. 4C, layout diagram 439R_4C includes: a first instance (not shown) of ARD1 in the seventh cell region and a second instance (not shown) of ARD1 in the eighth cell region; M0_PG segments correspondingly in the seventh and eighth cell regions; M0_rte segments correspondingly in the seventh and eighth cell regions; and gate lines correspondingly in the seventh and/or eighth cell regions. In some embodiments, the leftmost gate line and the rightmost gate line of the seventh cell region are replaced by corresponding IDGs. In some embodiments, the leftmost gate line and the rightmost gate line of the eighth cell region are replaced by corresponding IDGs.

In FIG. 4D, layout diagram 439R_4D includes: a first instance of ARD2 in the seventh cell region and a second instance of ARD2 in the eighth cell region; BM0_PG segments BM0_PG(6) and BM0_PG(7) correspondingly in the seventh and eighth cell regions; BM0_rte segments BM0_rte(9)-BM0_rte(11) correspondingly in the seventh and eighth cell regions; buried gate lines correspondingly in the seventh and/or eighth cell region; and two instances of a BVG contact structure coupled to BM0_rte segment BM0_rte(10). In some embodiments, the leftmost buried gate line and the rightmost buried gate line of the seventh cell region are replaced by corresponding IDGs. In some embodiments, the leftmost buried gate line and the rightmost buried gate line of the eighth cell region are replaced by corresponding IDGs.

A seventh given cell region according to the second other approach that is a counterpart to the SDFQD1 cell region corresponding to floorplan 241, front side layout diagram 439F_4C and back side layout diagram 439R_4D is represented by two instances of an eighth given cell region according to the second other approach that are stacked on each other. The back side of each of the two instances of the eighth given cell region has BM0_rte segments aligned to two beta tracks, i.e., two aligned beta tracks per instance of the eighth cell region. The seventh given cell region includes two counterpart instances of ARD2 and six instances of a BVG contact structure, which reduce the corresponding heights of the two counterpart instances of back side ARD2 in the seventh given cell region. A benefit of the SDFQD1 cell region corresponding to floorplan 241, front side layout diagram 439F_4C and back side layout diagram 439R_4D is that five instances of a BVG contact structure are avoided which facilitates at least the first instance of ARD2 in the seventh cell region being taller than each of the two counterpart instances of back side ARD2 in the seventh given cell region according to the second other approach. In some embodiments, the second instance of ARD2 in the eighth cell region of FIG. 4D is shorter than the counterpart back side ARD2 in each of the three instances of the eighth given cell region according to the second other approach.

The two instances of the eighth given cell region according to the second other approach have an average of 2.0 aligned beta tracks per cell region. The seventh and eighth cell regions of FIG. 4D correspondingly have BM0_rte segments aligned correspondingly to two beta tracks and one beta track. Taken together, the seventh and eighth cell regions of FIGS. 4C-4D have an average of 2.5 aligned beta tracks per cell region which represents at least an improvement in routing resources as compared to the seventh given cell region according to the second other approach.

Back side layout diagram 439R_4D is an example of a VGTB-reduced layout diagram that uses at least one taller version of back side ARD2. In some embodiments of the SDFQD1 cell region corresponding floorplan 241, front side layout diagram 439F_4C and back side layout diagram 439R_4D, the use of the at least one taller version of back side ARD2 in the VGTB-reduced layout diagram yields corresponding cell regions that exhibit speed improvements of about 7.6% as compared to non-VGTB-reduced counterpart layout diagrams.

Figure 5A:
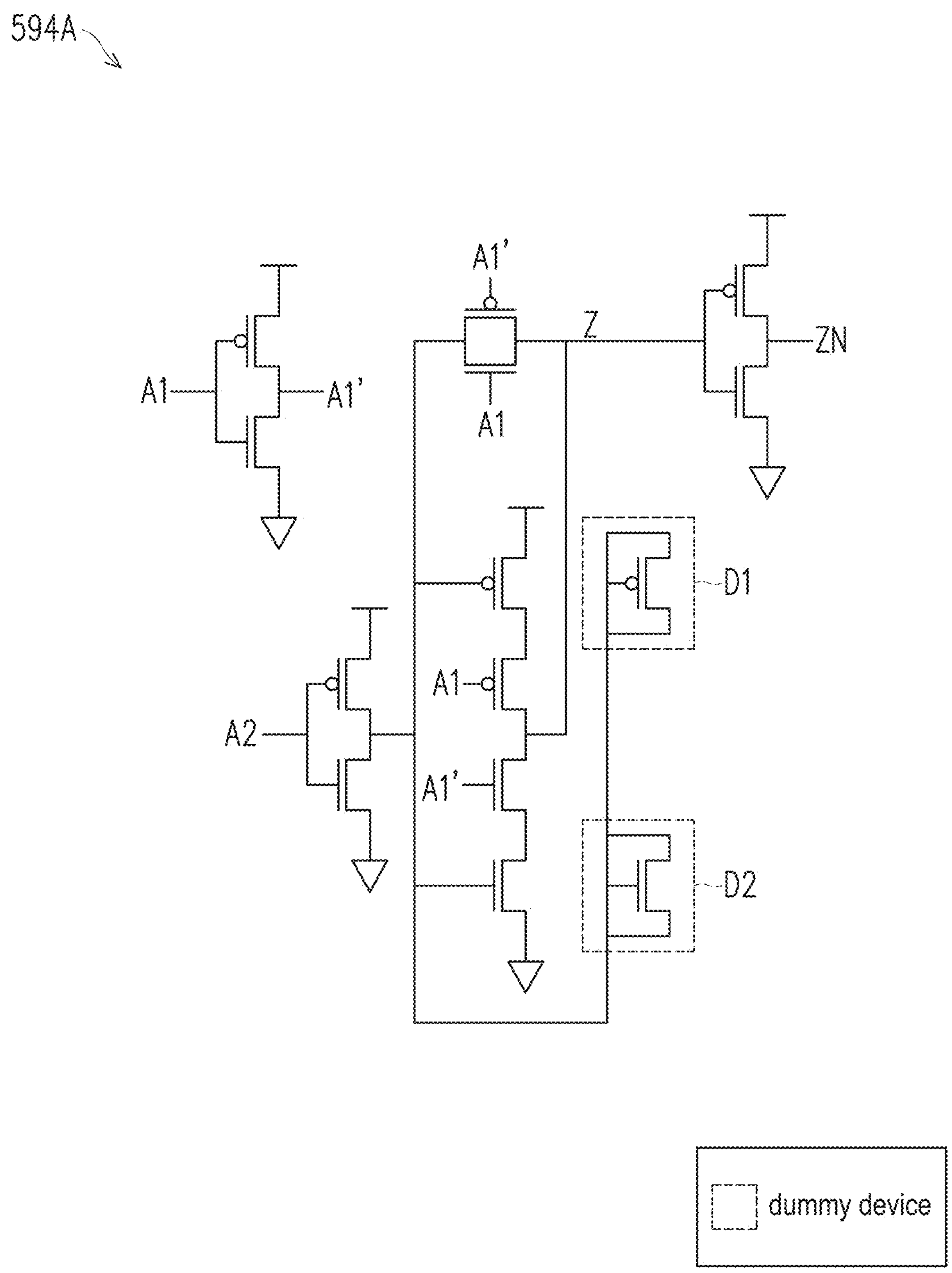
FIGS. 5A-5B are corresponding circuit diagrams, in accordance with some embodiments.
Figure 5B:
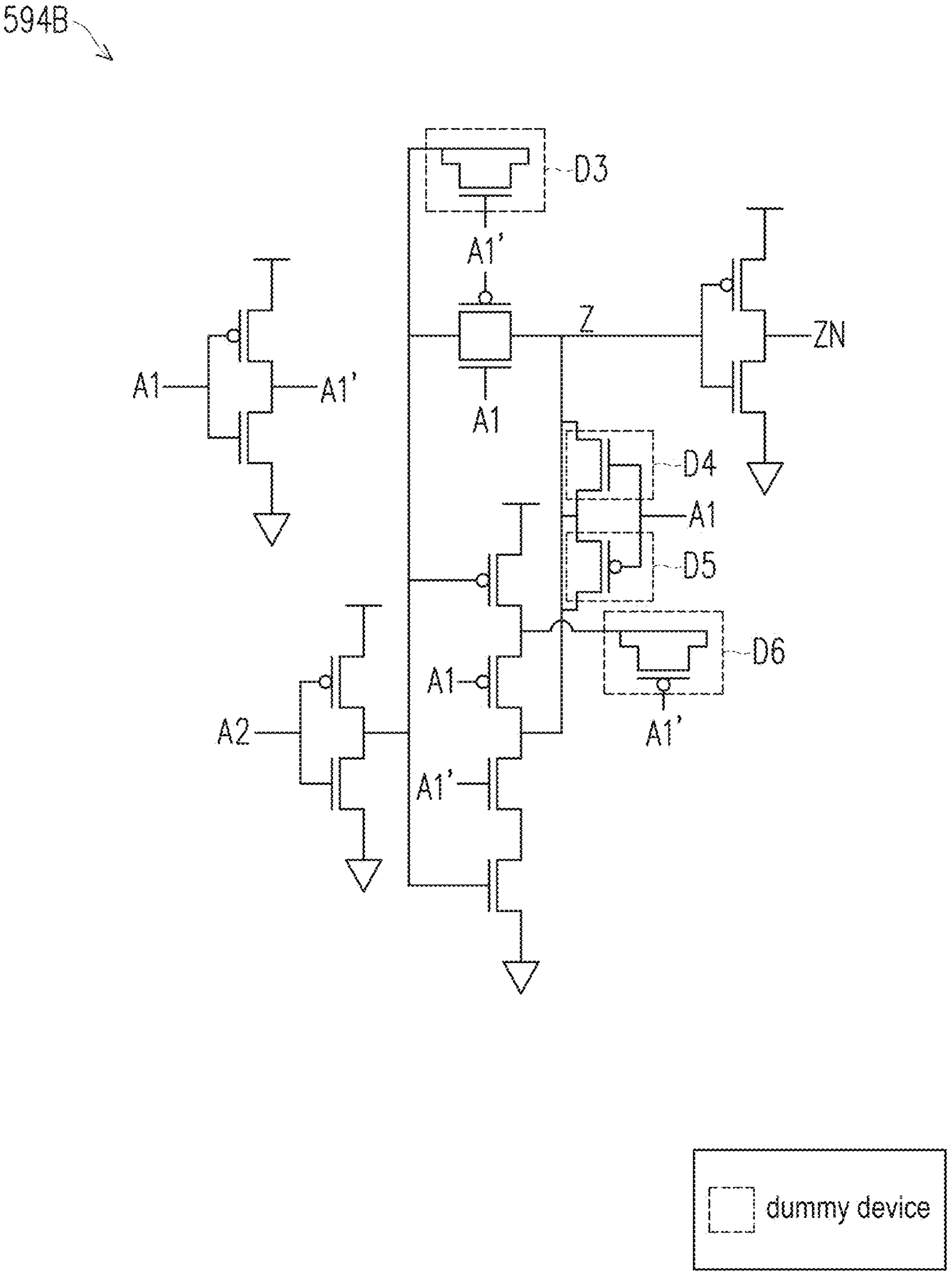

FIGS. 5A-5B are corresponding circuit diagrams of XOR/XNR 594A and XOR/XNR 594B, in accordance with some embodiments.

In some embodiments, XOR/XNR is an alphanumeric text string used as an adjective that is intended to connote that the circuit diagram is an exclusive OR (XOR) and an exclusive NOR (XNR) circuit. In each of FIGS. 5A-5B, a logical XOR output is generated at a node Z. A logical XNR output is the inverse of a logical XOR output. Node Z is coupled to a node ZN by an inverter. A logical XNR output is generated at node ZN.

In FIG. 5A, XOR/XNR 594A includes dummy devices D1-D2. Dummy device D1 is a shorted NMOS field-effect transistor (FET) (NFET). Dummy device D2 is a shorted PMOS FET (PFET).

In FIG. 5B, XOR/XNR 594B includes dummy devices D3-D6. Each of dummy devices D3 and D4 is a capacitor-configured NFET. Each of dummy devices D5 and D6 is a capacitor-configured PFET.

Figure 5C:
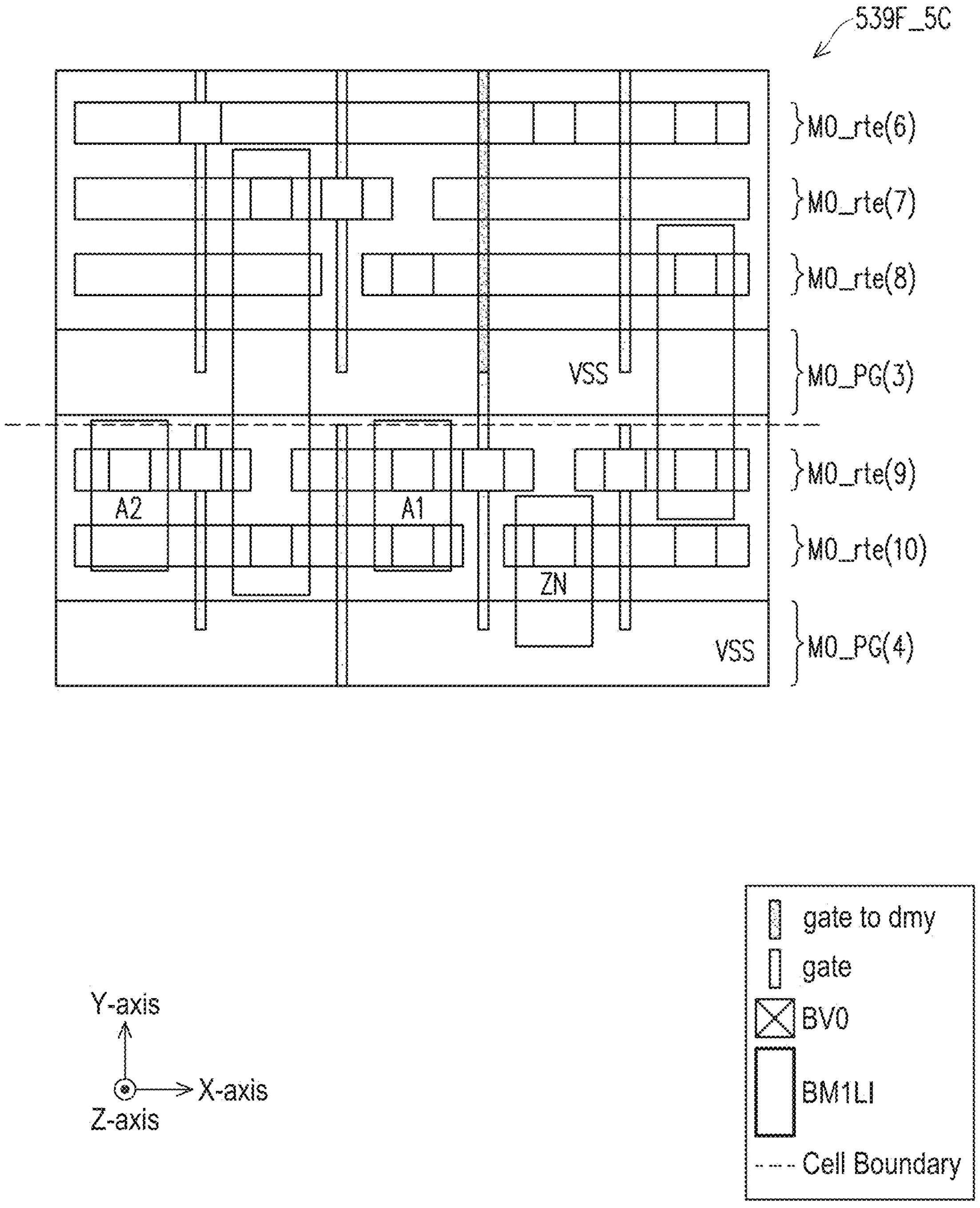
FIGS. 5C-5F are corresponding layout diagrams of corresponding devices, in accordance with some embodiments.
Figure 5D:
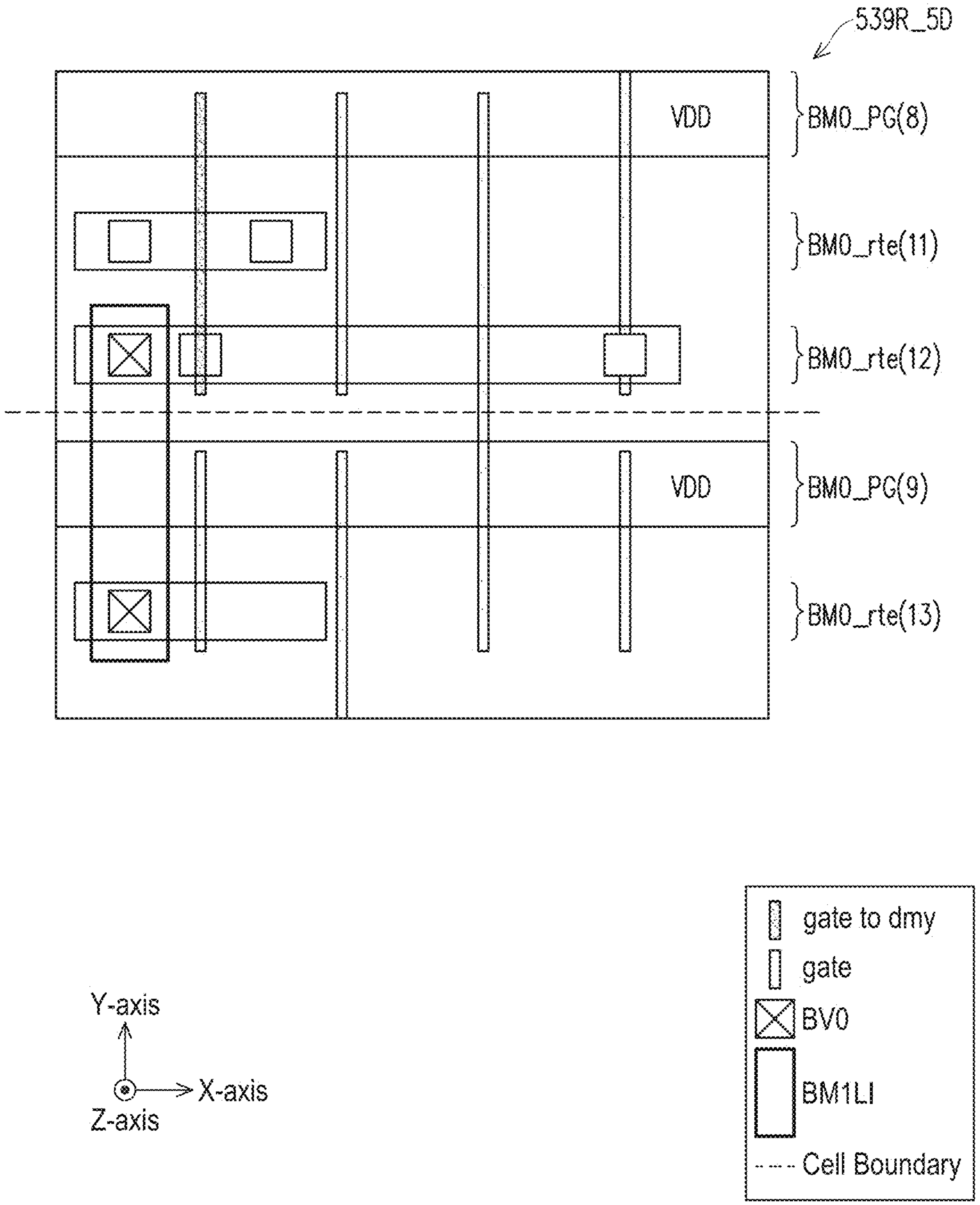

FIGS. 5C-5D are corresponding front side 539F_5C and back side 539R_5D layout diagrams of XOR/XNR 594A of FIG. 5A, in accordance with some embodiments.

Regarding each of FIGS. 5C-5D, and relative to a cell boundary extending parallel to the X-axis, an XOR/XOR cell region representing XOR/XNR 594A and based on front side layout diagram 539F_5C and back side layout diagram 539R_5D is arranged into a ninth cell region above the cell boundary and a tenth cell region below the cell boundary. The ninth cell region has an arrangement similar to cell region 102(1). The tenth cell region has an arrangement similar to cell region 110(1). Each of the ninth cell region and the tenth cell region has a width of 5 CPP. The ninth cell region has a height h_102(1). The tenth cell region has height h_110(1). Together, the ninth and tenth cell regions are an example of stacked pair, e.g., stacked pair 188(2).

In FIG. 5C, layout diagram 539F_5C includes: a first instance (not shown) of ARD1 in the ninth cell region and a second instance (not shown) of ARD1 in the tenth cell region; M0_PG segments M0_PG(3) and M0_PG(4) correspondingly in the ninth and tenth cell regions; M0_rte segments M0_rte(6)-M0_rte(10) correspondingly in the ninth and tenth cell regions; and gate lines correspondingly in the ninth and/or tenth cell regions. In some embodiments, the leftmost gate line and the rightmost gate line of the ninth cell region are replaced by corresponding IDGs. In some embodiments, the leftmost gate line and the rightmost gate line of the tenth cell region are replaced by corresponding IDGs.

In FIG. 5D, layout diagram 539R_5D includes: a first instance (not shown) of ARD2 in the ninth cell region and a second instance (not shown) of ARD2 in the tenth cell region; BM0_PG segments BM0_PG(8) and BM0_PG(9) correspondingly in the ninth and tenth cell regions; BM0_rte segments BM0_rte(11)-BM0_rte(13) correspondingly in the ninth and tenth cell regions; and buried gate lines correspondingly in the ninth and/or tenth cell region. In some embodiments, the leftmost buried gate line and the rightmost buried gate line of the ninth cell region are replaced by corresponding IDGs. In some embodiments, the leftmost buried gate line and the rightmost buried gate line of the tenth cell region are replaced by corresponding IDGs.

Layout diagram 539R_5D further includes a BM1_rte segment BM1LI and two instances of a via-to-BM0_rte (BVO) contact structure. BM1_rte segment BM1LI is coupled to BM0_rte segments BM0_rte(12) and BM0_rte (13) correspondingly by the instances of the BVO contact structure. In some embodiments, BM1LI is an alphanumeric text string used as an adjective that is intended to connote that the BM1_rte segment is a local interconnect (LI) structure.

In FIG. 5C, it is assumed that ARD1 is doped with a P-type dopant such that each of M0_PG(3) and M0_PG(4) is configured for carrying/conducting Vref1=VSS. In FIG. 5D, it is assumed that ARD2 is doped with an N-type dopant such that each of BM0_PG(8) and BM0_PG(9) is configured for carrying/conducting Vref2=VDD.

In FIG. 5C, a selected one of the gate lines is shown with a different fill color and/or pattern to reflect the selected gate line being coupled to dummy device D1. In FIG. 5D, a selected one of the buried gate lines is shown with a different fill color and/or pattern to reflect that selected buried gate line being coupled to dummy device D2.

Back side layout diagram 539R_5D is an example of a VGTB-reduced layout diagram that uses at least one taller version of back side ARD2 as compared to a ninth given cell region according to the second other approach that is a counterpart to XOR/XOR 594A based on front side layout diagram 539F_5C and back side layout diagram 539R_5D. In some embodiments of XOR/XOR 594A based on front side layout diagram 539F_5C and back side layout diagram 539R_5D, the use of the at least one taller version of back side ARD2 in the VGTB-reduced layout diagram yields corresponding cell regions that exhibit speed improvements of about 7% as compared to non-VGTB-reduced counterpart layout diagrams.

Figure 5E:
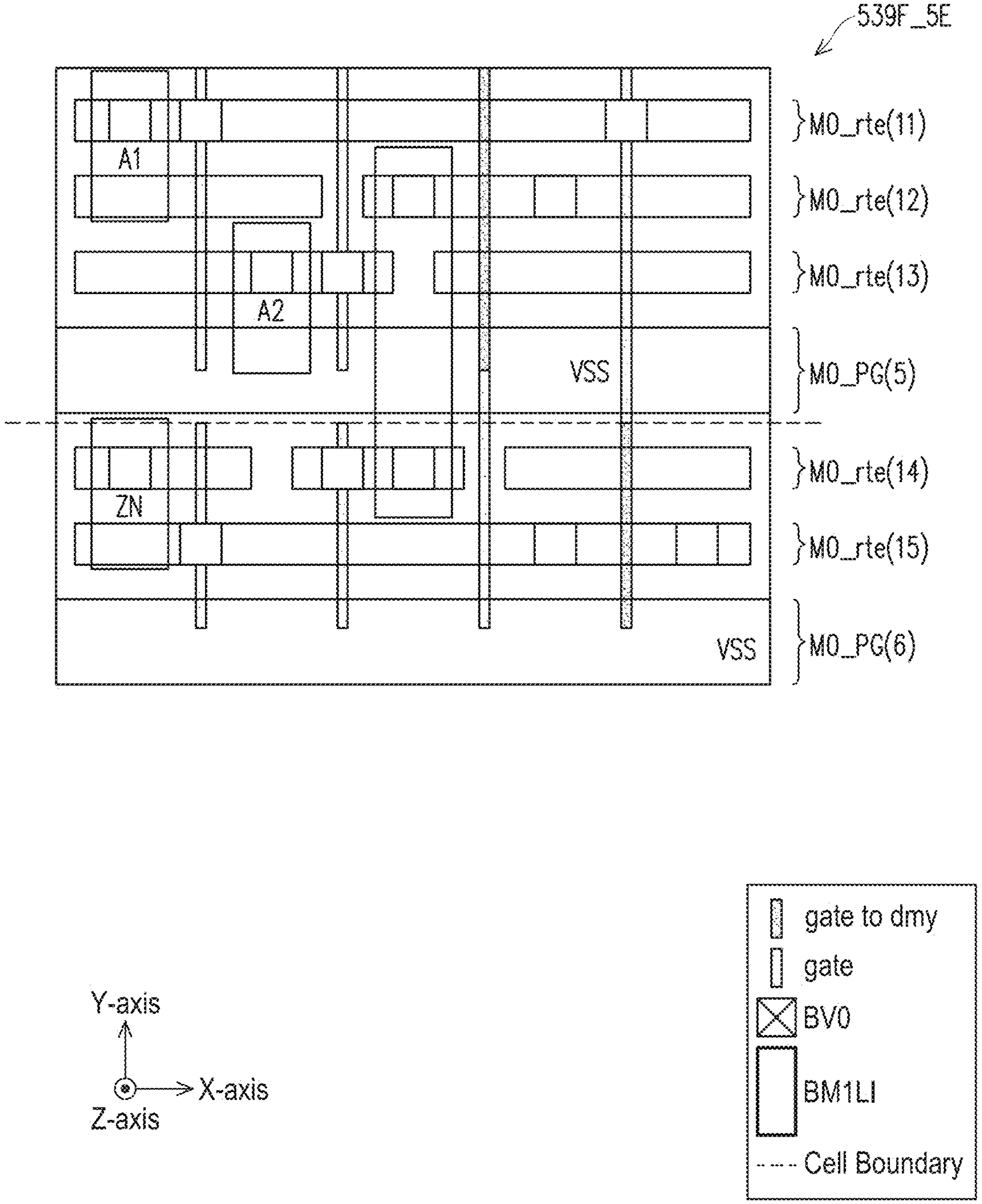
Figure 5F:
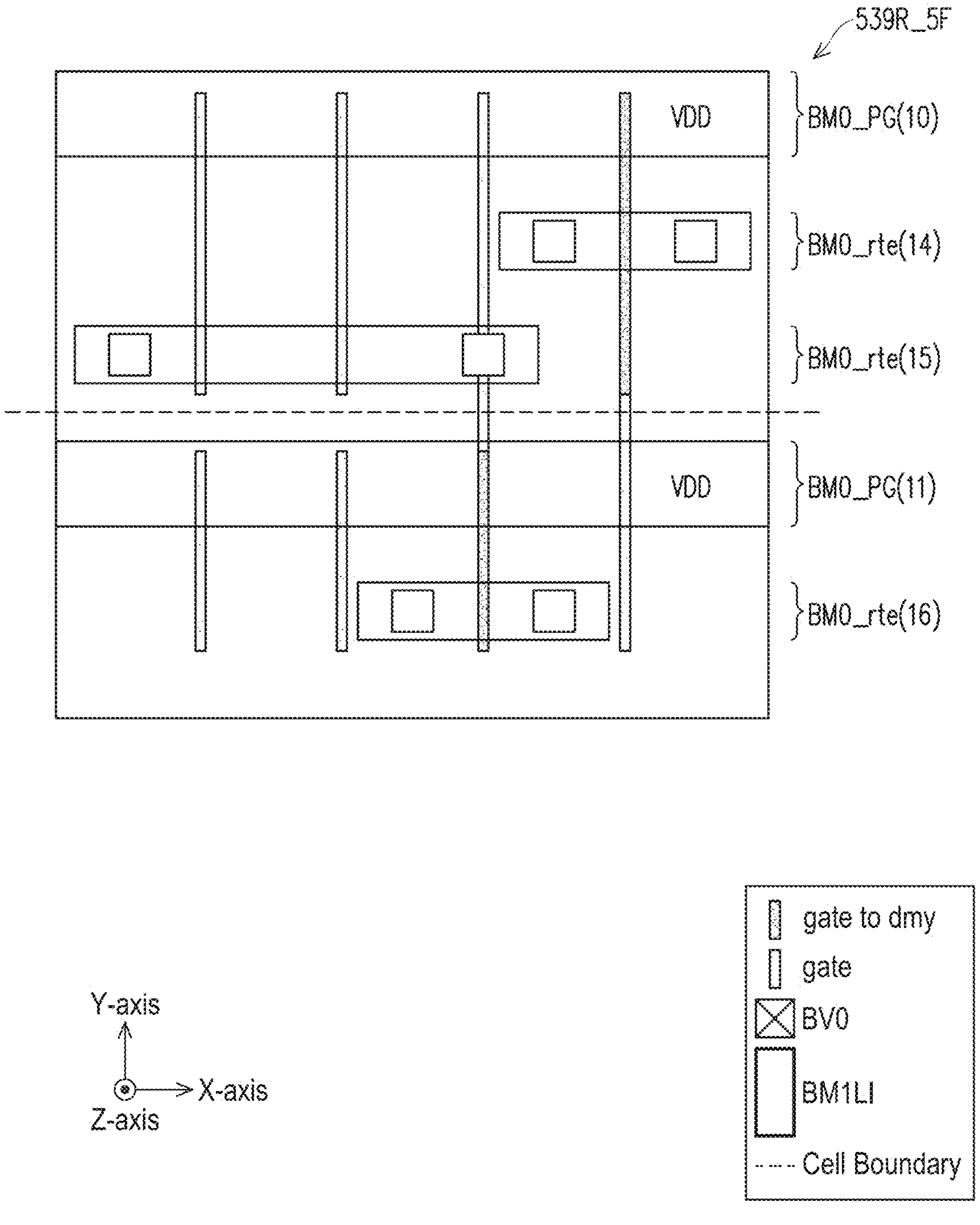

FIGS. 5E-5F are corresponding front side 539F_5E and back side 539R_5F layout diagrams of XOR/XNR 594B of FIG. 5B, in accordance with some embodiments.

Regarding each of FIGS. 5E-5F, and relative to a cell boundary extending parallel to the X-axis, an XOR/XOR cell region representing XOR/XNR 594B and based on front side layout diagram 539F_5E and back side layout diagram 539R_5F is arranged into an eleventh cell region above the cell boundary and a twelfth cell region below the cell boundary. The eleventh cell region has an arrangement similar to cell region 102(1). The twelfth cell region has an arrangement similar to cell region 110(1). Each of the eleventh cell region and the twelfth cell region has a width of 5 CPP. The eleventh cell region has a height h_102(1). The twelfth cell region has height h_110(1). Together, the eleventh and twelfth cell regions are an example of stacked pair, e.g., stacked pair 188(2).

In FIG. 5E, layout diagram 539F_5E includes: a first instance (not shown) of ARD1 in the eleventh cell region and a second instance (not shown) of ARD1 in the twelfth cell region; M0_PG segments M0_PG(5) and M0_PG(6) correspondingly in the eleventh and twelfth cell regions; M0_rte segments M0_rte(11)-M0_rte(15) correspondingly in the eleventh and twelfth cell regions; and gate lines correspondingly in the eleventh and/or twelfth cell regions. In some embodiments, the leftmost gate line and the rightmost gate line of the eleventh cell region are replaced by corresponding IDGs. In some embodiments, the leftmost gate line and the rightmost gate line of the twelfth cell region are replaced by corresponding IDGs.

In FIG. 5F, layout diagram 539R_5F includes: a first instance (not shown) of ARD2 in the eleventh cell region and a second instance (not shown) of ARD2 in the twelfth cell region; BM0_PG segments BM0_PG(10) and BM0_PG (11) correspondingly in the eleventh and twelfth cell regions; BM0_rte segments BM0_rte(14)-BM0_rte(16) correspondingly in the eleventh and twelfth cell regions; and buried gate lines correspondingly in the eleventh and/or twelfth cell region. In some embodiments, the leftmost buried gate line and the rightmost buried gate line of the eleventh cell region are replaced by corresponding IDGs. In some embodiments, the leftmost buried gate line and the rightmost buried gate line of the twelfth cell region are replaced by corresponding IDGs.

In FIG. 5E, it is assumed that ARD1 is doped with a P-type dopant such that each of M0_PG(5) and M0_PG(6) is configured for carrying/conducting Vref1=VSS. In FIG. 5F, it is assumed that ARD2 is doped with an N-type dopant such that each of BM0_PG(10) and BM0_PG(11) is configured for carrying/conducting Vref2=VDD.

In FIG. 5E, two selected ones of the gate lines are shown with a different fill color and/or pattern to reflect the selected gate lines being coupled correspondingly to dummy devices D3-D4. In FIG. 5F, two selected ones of the buried gate lines are shown with a different fill color and/or pattern to reflect that selected buried gate line being coupled correspondingly to dummy devices D5-D6.

Backside layout diagram 539R_5F of FIG. 5F omits BM1_rte segment BM1LI and the two instances of a BVO contact structure of backside layout diagram 539R_5D of FIG. 5D. While XOR/XNR 549B is not as fast as XOR/XNR 594A, nevertheless an XOR/XOR cell region representing XOR/XNR 594B and based on front side layout diagram 539F_5E and back side layout diagram 539R_5F is produced using two fewer EUV masks than are used to produce an XOR/XOR cell region representing XOR/XNR 594A and based on front side layout diagram 539F_5C and back side layout diagram 539R_5D of corresponding FIGS. 5C-5D.

Figure 6:
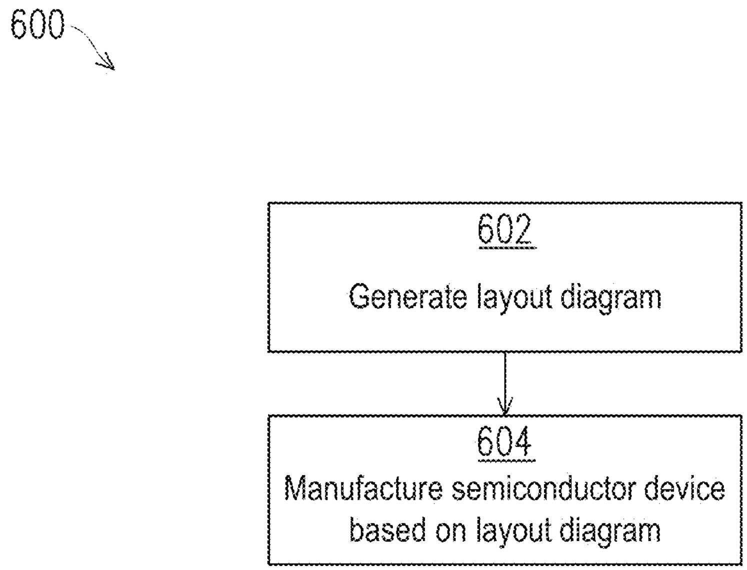

FIG. 6 is a flowchart 600 of a method of manufacturing a memory device, in accordance with some embodiments.

The method of flowchart (flow diagram) 600 is implementable, for example, using EDA system 800 (FIG. 8, discussed below) and an IC manufacturing system 900 (FIG. 9, discussed below), in accordance with some embodiments. Examples of a device which can be manufactured according to the method of flowchart 600 include devices based on the layout diagrams disclosed herein, or the like.

In FIG. 6, the method of flowchart 600 includes blocks 602-604. At block 602, a layout diagram is generated which, among other things, includes one or more of layout diagrams disclosed herein, layout diagrams corresponding to one or more of the devices disclosed herein, or the like. Block 602 is implementable, for example, using EDA system 800 (FIG. 8, discussed below), in accordance with some embodiments. From block 602, flow proceeds to block 604.

At block 604, based on the layout diagram, at least one of (A) one or more photolithographic exposures are made or (b) one or more photolithography masks are fabricated or (C) one or more components in a layer of a device, e.g., a semiconductor device are fabricated. See discussion below of IC manufacturing system 900 in FIG. 9 below.

FIG. 7A is a flowchart 710A of a method of fabricating a device, in accordance with some embodiments.

Figure 7B:
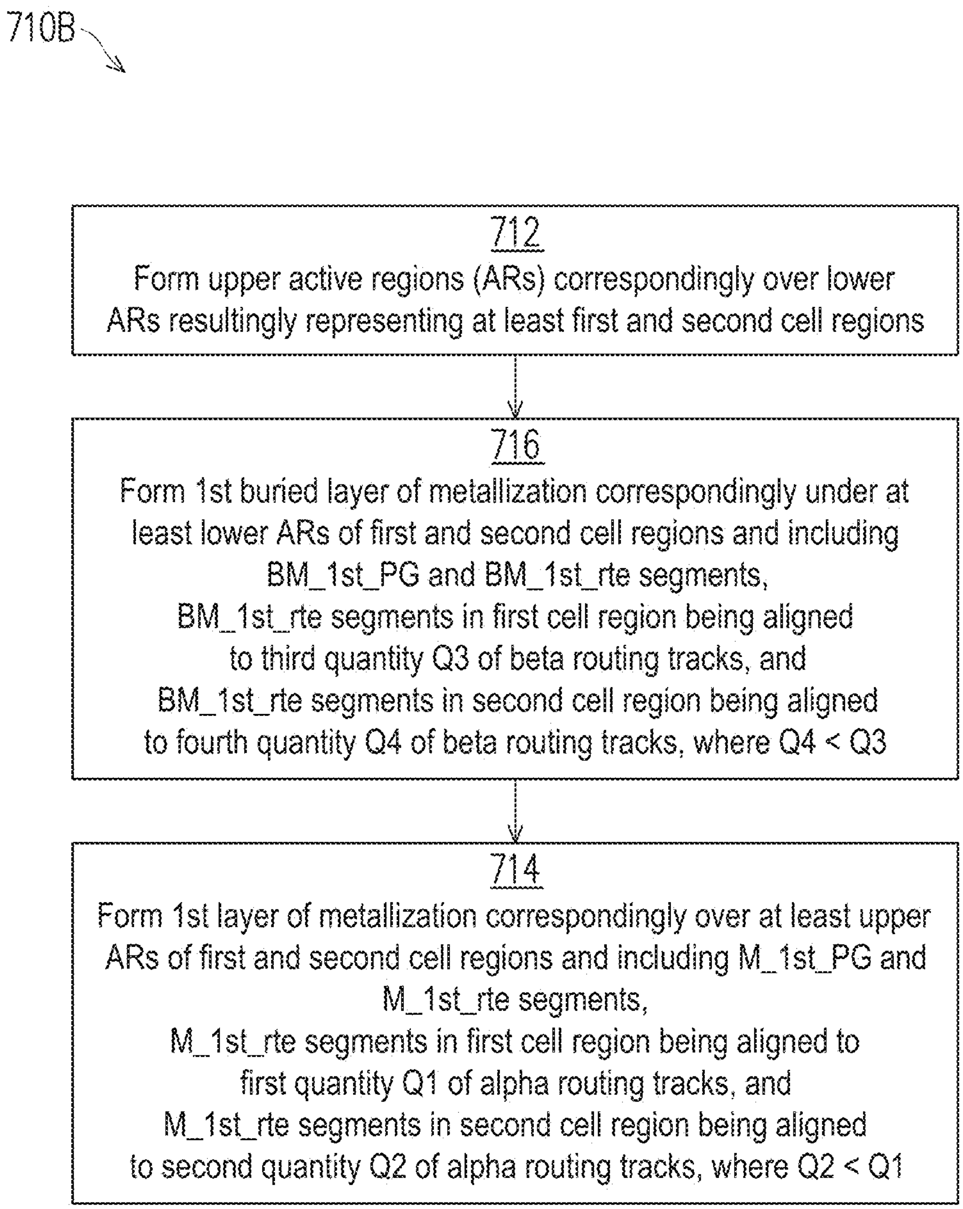

Flowchart 710A is an example of block 604 of FIG. 6. Flowchart 710A includes blocks 712-716. Flowchart 710A shows the following sequence: block 712→block 714→block 716. In some embodiments, other sequences of blocks 712-716. are provided (FIG. 7B). Examples provided in the context of flowchart 710A assume first, second and third orthogonal directions that are, e.g., correspondingly parallel to the X-axis, Y-axis and Z-axis. The method of flowchart 710A is implementable, for example, using IC manufacturing system 900 (FIG. 9, discussed below), in accordance with some embodiments. Examples of a device which can be manufactured according to the method of flowchart 710A include devices based on the layout diagrams disclosed herein, or the like.

At block 712, upper active regions are formed correspondingly over lower active regions including a first upper active region correspondingly over a first lower active region that together represent a first cell region and a second upper active region correspondingly over a second lower active region that together represent a second cell region, the upper active regions having a first type of dopant correspondingly over lower active regions having a second type of dopant different than the first type of dopant. The first upper and lower active regions together represent a first cell region. The second upper and lower active regions together represent a second cell region. Examples of the first upper and lower active regions correspondingly include ARD1 240(2) and ARD2 242(2) of FIGS. 2A-2B that represent cell region 102(1), or the like. Examples of the second upper and lower active regions correspondingly include ARD1 240(1) and ARD2 242(1) of FIGS. 2A-2B that represent cell region 110(1), or the like. Examples of the first and second dopants correspondingly are P-type and N-type dopants, or the like. From block 714, flow proceeds to block 716.

At block 714, first conductors are formed in a first layer of metallization (M_first layer) correspondingly over the upper active regions of at least the first and second cell regions. The first conductors include: first and second M_first power grid (PG) segments over the first and second cell regions and being configured correspondingly for a first reference voltage; first M_first routing segments over the first cell region, correspondingly aligned to a first quantity Q1 of M_first routing tracks and being configured for corresponding routing signals; and second M_first routing segments over the second cell region, correspondingly aligned to a second quantity Q2 of M_first routing tracks and being configured for corresponding routing signals, the second quantity Q2 being smaller than the first quantity Q1 such that Q2<Q1.

Regarding block 714, an example of the M_first layer is MET0 layer 118 of FIGS. 1A-1B, MET0 layer 218 of FIGS. 2A-2B, or the like.

Examples of the first and second M_first PG segments include M0_PG segment 124(1) and M0_PG segment 124 (2) in FIG. 1A configured for a first reference voltage (e.g., VSS), M0_PG segment 224(1) and M0_PG segment 224(2) in FIGS. 2A-2B configured for the first reference voltage (e.g., VSS), or the like.

Examples of the first routing tracks are the alpha routing tracks α1-α5 of FIG. 1A, or the like.

Examples of the first M_first routing segments over the first cell region include M0_rte segments 126(1)-126(3) of FIG. 1A correspondingly aligned to Q1=3 alpha tracks α1-α3, M0_rte segments 226(1)-226(3) of FIGS. 2A-2B, or the like.

Examples of the second M_first routing segments over the second cell region include M0_rte segments 126(4)-126(5)

of FIG. 1A correspondingly aligned to Q2=2 alpha tracks α4-α5 where (Q2=2)<(Q1=3), M0_rte segments 226(4)-226(5) of FIGS. 2A-2B, or the like.

From block 714, flow proceeds to block 716. At block 716, second conductors are formed in a first buried layer of metallization (BM_first layer) correspondingly under the lower active regions of at least the first and second cell regions. The second conductors include: first and second BM_first PG segments under the first and second cell regions and being configured correspondingly for a second reference voltage; first BM_first routing segments under the first cell region, correspondingly aligned to a third quantity Q3 of BM_first routing tracks and being configured for corresponding routing signals; and second BM_first routing segments under the second cell region, correspondingly aligned to a fourth quantity Q4 of BM_first routing tracks and being configured for corresponding routing signals, the fourth quantity Q4 being smaller than the third quantity Q3 such that Q4<Q3.

Regarding block 716, an example of the BM_first layer is BMET0 layer 122 of FIGS. 1A-1B, 222 of FIGS. 2A-2B, or the like.

Examples of the first and second BM_first PG segments include BM0_PG segment 128(1) and BM0_PG segment 128(2) in FIG. 1A configured for a second reference voltage (e.g., VDD), BM0_PG segment 228(1) and BM0_PG segment 228(2) in FIGS. 2A-2B configured for the second reference voltage (e.g., VDD), or the like.

Examples of the second routing tracks are the beta routing tracks β1-β3 of FIG. 1A, or the like.

Examples of the first BM_first routing segments under the first cell region include BM0_rte segments 130(1)-130(2) of FIG. 1A correspondingly aligned to Q3=2 beta tracks β1-β2, BM0_rte segments 230(1)-230(2) of FIGS. 2A-2B, or the like.

Examples of the second BM_first routing segments under the second cell region include BM0_rte segment 130(3) of FIG. 1A correspondingly aligned to Q4=1 beta track 33 where (Q4=1)<(Q3=2), BM0_rte segment 230(3) of FIGS. 2A-2B, or the like.

In some embodiments, the sequence of flow in flowchart 710A is described as forming front side layers before back side layers. An example of the front side is front side 139F_1B in FIG. 1B, front side 239F in FIGS. 2A-2B, or the like. An example of the back side is back side 139R_1B in FIG. 1B, back side 239R in FIGS. 2A-2B, or the like.

FIG. 7B is a flowchart 710B of a method of fabricating a device, in accordance with some embodiments.

Flowchart 710B is similar to flowchart 710A of FIG. 7A in that, e.g., flowchart 710B includes the same blocks as flowchart 710, namely blocks 712-716. Flowchart 710B differs from flowchart 710A in that flowchart 710B shows a different sequence of flow through blocks 712-716 as compared to the sequence shown in flowchart 710A.

In FIG. 7B, flowchart 710B shows the following sequence: block 712→block 716→block 716. In some embodiments, the sequence of flowchart 710B is described as forming back side layers before front side layers.

Figure 8:
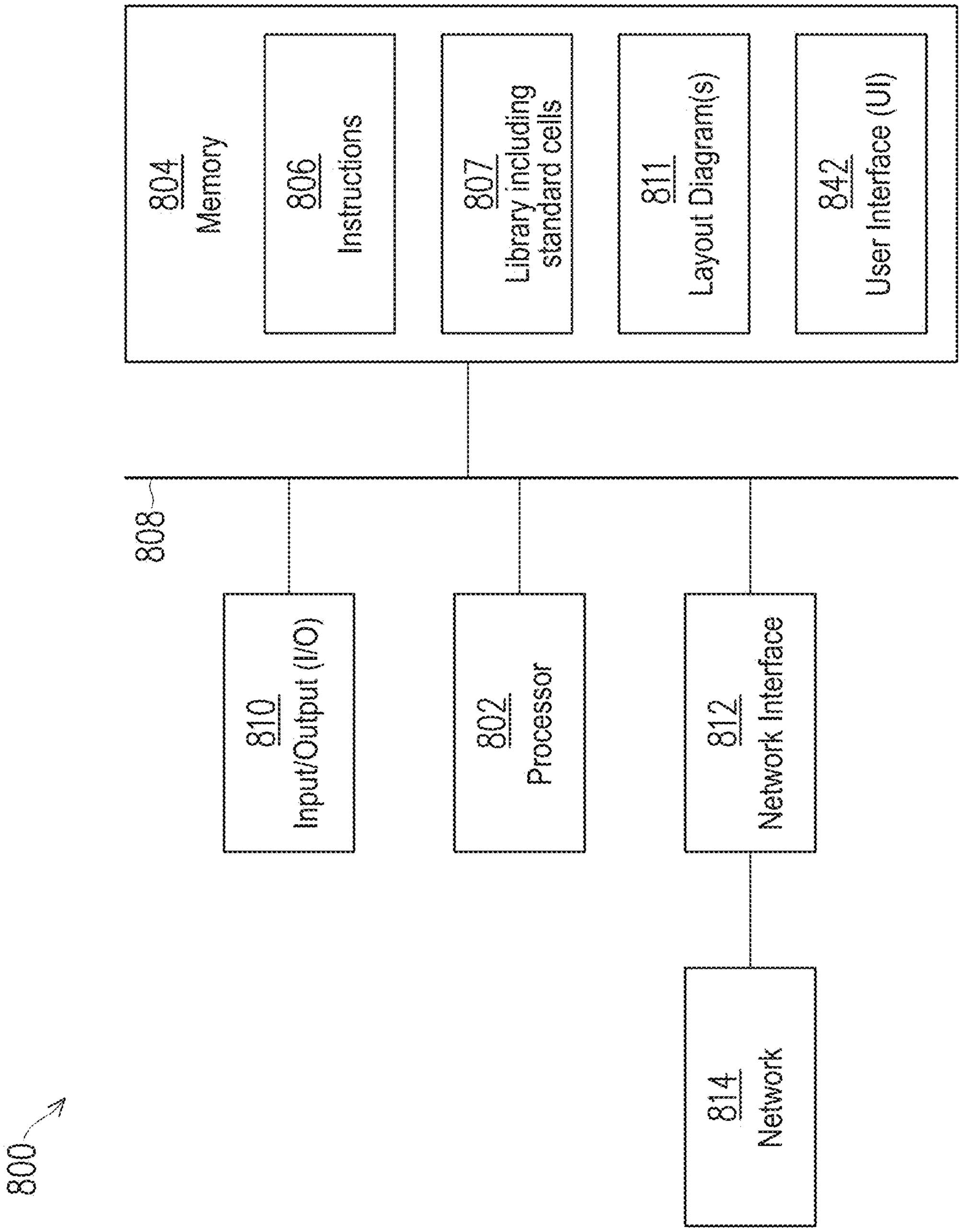
FIG. 8 is a block diagram of an electronic design automation (EDA) system in accordance with some embodiments.

FIG. 8 is a block diagram of an electronic design automation (EDA) system 800 in accordance with some embodiments.

In some embodiments, EDA system 800 includes an automatic placement and routing (APR) system. In some embodiments, EDA system 800 is a general purpose computing device including a hardware processor 802 and a non-transitory, computer-readable storage medium 804. Storage medium 804, amongst other things, is encoded with, i.e., stores, computer program code 806, i.e., a set of executable instructions. Execution of instructions 806 by hardware processor 802 represents (at least in part) an EDA tool which implements a portion or all of, e.g., methods such as the methods disclosed herein of generating layout diagrams, methods of generating layout diagrams such as the layout diagrams disclosed herein or layout diagrams corresponding to the devices disclosed herein, or the like, in accordance with one or more embodiments (hereinafter, the noted processes and/or methods).

Storage medium 804, amongst other things, stores layout diagrams 811 such as the layout diagrams disclosed herein, other the like.

Processor 802 is electrically coupled to computer-readable storage medium 804 via a bus 808. Processor 802 is further electrically coupled to an I/O interface 810 by a bus 808. A network interface 812 is further electrically connected to processor 802 via bus 808. Network interface 812 is connected to a network 814, so that processor 802 and computer-readable storage medium 804 are capable of connecting to external elements via network 814. Processor 802 is configured to execute computer program code 806 encoded in computer-readable storage medium 804 in order to cause system 800 to be usable for performing a portion or all of the noted processes and/or methods. In one or more embodiments, processor 802 is a central processing unit (CPU), a multi-processor, a distributed processing system, an application specific integrated circuit (ASIC), and/or a suitable processing unit.

In one or more embodiments, computer-readable storage medium 804 is an electronic, magnetic, optical, electromagnetic, infrared, and/or a semiconductor system (or apparatus or device). For example, computer-readable storage medium 804 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 804 includes a compact disk-read only memory (CD-ROM), a compact disk-read/write (CD-R/W), and/or a digital video disc (DVD).

In one or more embodiments, storage medium 804 stores computer program code 806 configured to cause system 800 (where such execution represents (at least in part) the EDA tool) to be usable for performing a portion or all of the noted processes and/or methods. In one or more embodiments, storage medium 804 further stores information which facilitates performing a portion or all of the noted processes and/or methods. In one or more embodiments, storage medium 804 stores library 807 of standard cells including such standard cells as disclosed herein. In some embodiments, storage medium 804 stores one or more layout diagrams 811.

EDA system 800 includes I/O interface 810. I/O interface 810 is coupled to external circuitry. In one or more embodiments, I/O interface 810 includes a keyboard, keypad, mouse, trackball, trackpad, touchscreen, and/or cursor direction keys for communicating information and commands to processor 802.

EDA system 800 further includes network interface 812 coupled to processor 802. Network interface 812 allows system 800 to communicate with network 814, to which one or more other computer systems are connected. Network interface 812 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 800.

System 800 is configured to receive information through I/O interface 810. The information received through I/O interface 810 includes one or more of instructions, data, design rules, libraries of standard cells, and/or other parameters for processing by processor 802. The information is transferred to processor 802 via bus 808. EDA system 800 is configured to receive information related to a user interface (UI) through I/O interface 810. The information is stored in computer-readable medium 804 as UI 842.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 800. In some embodiments, a layout which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 9:
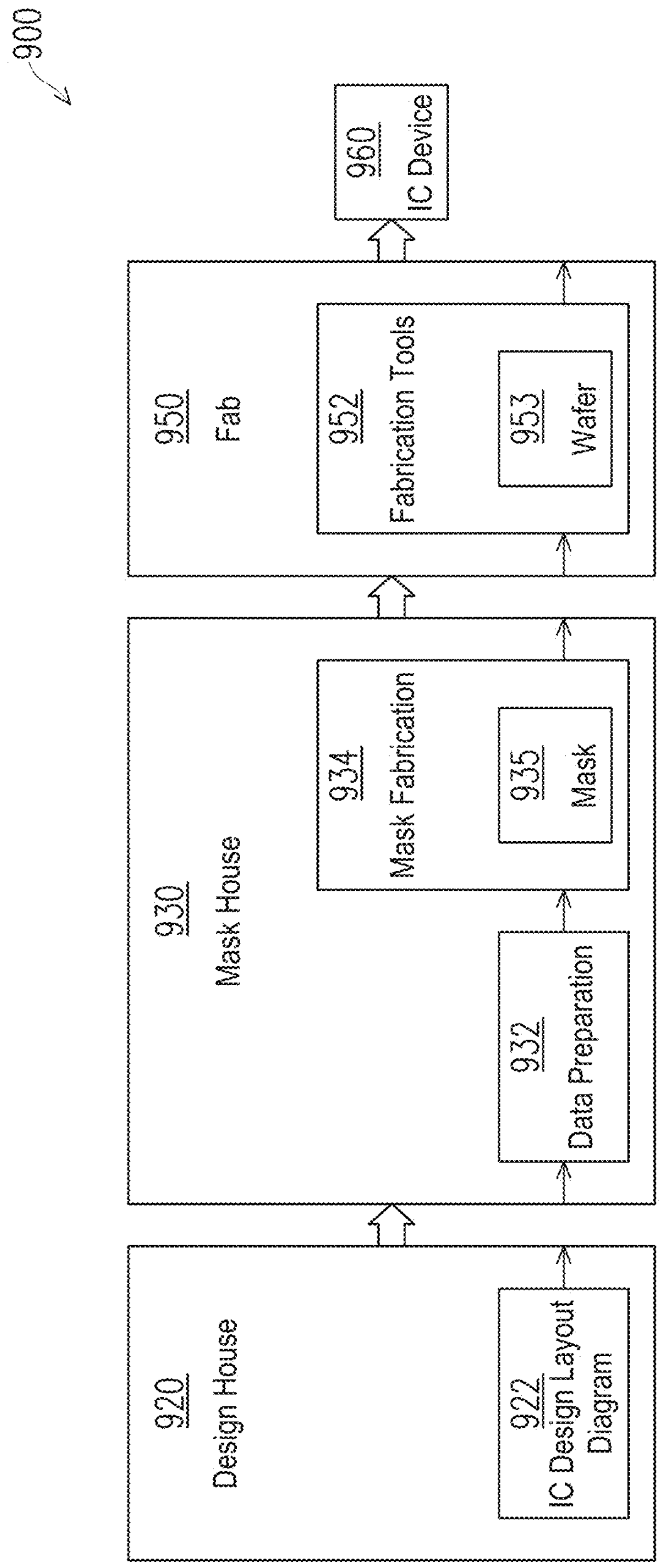
FIG. 9 is a block diagram of an integrated circuit (IC) manufacturing system, and an IC manufacturing flow associated therewith, in accordance with some embodiments.

FIG. 9 is a block diagram of an integrated circuit (IC) manufacturing system 900, and an IC manufacturing flow associated therewith, in accordance with some embodiments.

In some embodiments, based on the layout diagram generated by block 602 of FIG. 6, the IC manufacturing system 900 implements block 604 of FIG. 6 wherein at least one of (A) one or more semiconductor masks or (B) at least one component in a layer of an inchoate semiconductor integrated circuit is fabricated using manufacturing system 900. In some embodiments, the IC manufacturing system 900 implements the flowcharts of FIGS. 7A-7B.

In FIG. 9, IC manufacturing system 900 includes entities, such as a design house 920, a mask house 930, and an IC manufacturer/fabricator ("fab") 950, that interact with one another in the design, development, and manufacturing cycles and/or services related to manufacturing an IC device 960. The entities in system 900 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and supplies services to and/or receives services from one or more of the other entities. In some embodiments, two or more of design house 920, mask house 930, and IC fab 950 is owned by a single larger company. In some embodiments, two or more of design house 920, mask house 930, and IC fab 950 coexist in a common facility and use common resources.

Design house (or design team) 920 generates an IC design layout 922. IC design layout 922 includes various geometrical patterns designed for an IC device 960. The geometrical patterns correspond to patterns of metal, oxide, or semiconductor layers that make up the various components of IC device 960 to be fabricated. The various layers combine to form various IC features. For example, a portion of IC design layout 922 includes various IC features, such as an active region, gate terminal, source and drain, metal lines or vias of an interlayer interconnection, and openings for bonding pads, to be formed in a semiconductor substrate (such as a silicon wafer) and various material layers disposed on the semiconductor substrate. Source/drain region(s) may refer to a source or a drain, individually or collectively, dependent upon the context. Design house 920 implements a proper design procedure to form IC design layout 922. The design procedure includes one or more of logic design, physical design or place and route. IC design layout 922 is presented in one or more data files having information of the geometrical patterns. For example, IC design layout 922 is expressed in a GDSII file format or DFII file format.

Mask house 930 includes data preparation 932 and mask fabrication 934. Mask house 930 uses IC design layout 922 to manufacture one or more masks 935 to be used for fabricating the various layers of IC device 960 according to IC design layout 922. Mask house 930 performs mask data preparation 932, where IC design layout 922 is translated into a representative data file ("RDF"). Mask data preparation 932 supplies the RDF to mask fabrication 934. Mask fabrication 934 includes a mask writer. A mask writer converts the RDF to an image on a substrate, such as a mask (reticle) or a semiconductor wafer. The design layout is manipulated by mask data preparation 932 to comply with particular characteristics of the mask writer and/or requirements of IC fab 950. In FIG. 9, mask data preparation 932, mask fabrication 934, and mask 935 are illustrated as separate elements. In some embodiments, mask data preparation 932 and mask fabrication 934 are collectively referred to as mask data preparation.

In some embodiments, mask data preparation 932 includes optical proximity correction (OPC) which uses lithography enhancement techniques to compensate for image errors, such as those that can arise from diffraction, interference, other process effects and the like. OPC adjusts IC design layout 922. In some embodiments, mask data preparation 932 includes further resolution enhancement techniques (RET), such as off-axis illumination, sub-resolution adjust features, phase-shifting masks, other suitable techniques, and the like or combinations thereof. In some embodiments, inverse lithography technology (ILT) is further used, which treats OPC as an inverse imaging problem.

In some embodiments, mask data preparation 932 includes a mask rule checker (MRC) that checks the IC design layout that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout to compensate for limitations during mask fabrication 934, which may undo part of the modifications performed by OPC in order to meet mask creation rules.

In some embodiments, mask data preparation 932 includes lithography process checking (LPC) that simulates processing that will be implemented by IC fab 950 to fabricate IC device 960. LPC simulates this processing based on IC design layout 922 to fabricate a simulated manufactured device, such as IC device 960. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been fabricated by LPC, if the simulated device is not close enough in shape to satisfy design rules, OPC and/or MRC are be repeated to further refine IC design layout 922.

The above description of mask data preparation 932 has been simplified for the purposes of clarity. In some embodiments, mask data preparation 932 includes additional features such as a logic operation (LOP) to modify the IC design layout according to manufacturing rules. Additionally, the processes applied to IC design layout 922 during data preparation 932 may be executed in a variety of different orders.

After mask data preparation 932 and during mask fabrication 934, a mask 935 or a group of masks 935 are fabricated based on the modified IC design layout. In some embodiments, an electron-beam (e-beam) or a mechanism of multiple e-beams is used to form a pattern on a mask (photomask or reticle) based on the modified IC design layout. The masks are formed in various technologies. In some embodiments, the mask is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask includes a transparent substrate (e.g., fused quartz) and an opaque material (e.g., chromium) coated in the opaque regions of the mask. In another example, the mask is formed using a phase shift technology. In the phase shift mask (PSM), various features in the pattern formed on the mask are configured to have proper phase difference to enhance the resolution and imaging quality. In various examples, the phase shift mask is an attenuated PSM or alternating PSM. The mask(s) generated by mask fabrication 934 is used in a variety of processes. For example, such a mask(s) is used in an ion implantation process to form various doped regions in the semiconductor wafer, in an etching process to form various etching regions in the semiconductor wafer, and/or in other suitable processes.

IC fab 950 is an IC fabrication business that includes one or more manufacturing facilities for the fabrication of a variety of different IC products. In some embodiments, IC fab 950 is a semiconductor foundry. For example, there may be a manufacturing facility for the front end fabrication of a plurality of IC products (front-end-of-line (FEOL) fabrication), while a second manufacturing facility may supply the back end fabrication for the interconnection and packaging of the IC products (back-end-of-line (BEOL) fabrication), and a third manufacturing facility may supply other services for the foundry business.

IC fab 950 uses mask (or masks) 935 fabricated by mask house 930 to fabricate IC device 960 using fabrication tools 952. Thus, IC fab 950 at least indirectly uses IC design layout 922 to fabricate IC device 960. In some embodiments, a semiconductor wafer 953 is fabricated by IC fab 950 using mask (or masks) 935 to form IC device 960. Semiconductor wafer 953 includes a silicon substrate or other proper substrate having material layers formed thereon. Semiconductor wafer further includes one or more of various doped regions, dielectric features, multilevel interconnects, and the like (formed at subsequent manufacturing steps).

In some embodiments, a cell region (of a device) includes: a first active region having a first type of dopant over a second active region having a second type of dopant different than the first type of dopant; in a first layer of metallization (M_first layer) over the first active region, an M_first power grid (PG) segment configured for a first reference voltage, and M_first routing segments aligned to a first quantity of M_first routing tracks; and, in a first layer of metallization (BM_first layer) under the second active region, a BM_first PG segment configured for a second reference voltage different than the first reference voltage, and BM_first routing segments aligned to a second quantity of BM_first routing tracks, the second quantity being smaller than the first quantity.

In some embodiments, the second quantity of BM_first routing tracks is j, where j is a positive integer; and the first quantity of M_first routing tracks is j+1.

In some embodiments, 1≤j.

In some embodiments, 1≤j≤2.

In some embodiments, 1≤j.

In some embodiments, j=2.

In some embodiments, a device (includes): a first cell region stacked on a second cell region; each of the first and second cell regions including a first active region having a first type of dopant over a second active region having a second type of dopant different than the first type of dopant; in a first layer of metallization (M_first layer) over the first active region, M_first power grid (PG) segments having a first reference voltage, and M_first routing segments aligned correspondingly to M_first routing tracks; and, in a first layer of metallization (BM_first layer) under the second active region, BM_first PG segments having a second reference voltage different than the first reference voltage, and BM_first routing segments aligned correspondingly to BM_first routing tracks; ones of the M_first routing segments being aligned in the first and second cell regions correspondingly to first and second quantities of the M_first routing tracks, the second quantity being smaller than the first quantity; and ones of the BM_first routing segments being aligned in the first and second cell regions correspondingly to third and fourth quantities of the BM_first routing tracks, the fourth quantity being smaller than the third quantity.

In some embodiments, the second quantity of M_first routing tracks is j, where j is a positive integer; the first quantity of M_first routing tracks is j+1; the fourth quantity of BM_first routing tracks is k, where k is a positive integer; and the third quantity of BM_first routing tracks is k+1.

In some embodiments, k=j+1.

In some embodiments, k≤j.

In some embodiments, 1≤j.

In some embodiments, j=1.

In some embodiments, j=2.

In some embodiments, the first cell region is stacked on the second cell region relative to a first direction; the first and second cell regions represent a first instance of a stacked pair; the first and second cell regions are in a column extending in the first direction; and the device further comprises other instances of the stacked pair in the column.

In some embodiments, the first instance and other instances of the stacked pair are adjacent correspondingly in the column such that any two of the stacked pair are free from having an instance of another cell region therebetween.

In some embodiments, the first and second cell regions are corresponding first instances thereof; and neighboring instances of the stacked pair are separated correspondingly by other instances of the first cell region.

In some embodiments, the first and second cell regions are corresponding first instances thereof; and neighboring instances of the stacked pair are separated correspondingly by other instances of the second cell region.

In some embodiments, a method (of forming a device) includes: forming active regions including upper active regions having a first type of dopant correspondingly over lower active regions having a second type of dopant different than the first type of dopant, the active regions including a first upper active region correspondingly over a first lower active region that together represent a first cell region, and a second upper active region correspondingly over a second lower active region that together represent a second cell region; and forming first conductors in a first layer of metallization (M_first layer) correspondingly over the upper active regions, the first conductors including first and second M_first power grid (PG) segments over correspondingly the first and second cell regions and being configured for a first reference voltage, first M_first routing segments over the first cell region, correspondingly aligned to a first quantity of M_first routing tracks and being configured for corresponding routing signals, and second M_first routing segments over the second cell region, correspondingly aligned to a second quantity of M_first routing tracks and being configured for corresponding routing signals, the second quantity being smaller than the first quantity; and forming second conductors in a first layer of metallization (BM_first layer) correspondingly under the lower active regions, the second conductors including first and second BM_first PG segments correspondingly under the first and second cell regions and being configured for a second reference voltage different than the first reference voltage, first BM_first routing segments under the first cell region, correspondingly aligned to a third quantity of BM_first routing tracks and being configured for corresponding routing signals, and second BM_first routing segments under the second cell region, correspondingly aligned to a fourth quantity of BM_first routing tracks and being configured for corresponding routing signals, the fourth quantity being smaller than the third quantity.

In some embodiments, the second quantity of M_first routing tracks is j, where j is a positive integer; the first quantity of M_first routing tracks is j+1; the fourth quantity of BM_first routing tracks is k, where k is a positive integer; and the first quantity of BM_first routing tracks is k+1.

In some embodiments, k=j+1.

In some embodiments, k≤j.

In some embodiments, l≤j.

In some embodiments, j=1.

In some embodiments, j=2.

In some embodiments, the first cell region is stacked on the second cell region cell relative to a first direction; the forming active regions further includes forming the first upper active region and the first lower active region in a first location in a column that extends in a first direction; forming the second upper active region and the second lower active region in a second location in the column such that the second cell region is stacked on the first cell region; the first and second cell regions represent a first instance of a stacked pair; and the forming active regions yet further includes forming other instances of the stacked pair in the column.

In some embodiments, the forming active regions further includes locating the first instance and other instances of the stacked pair to be adjacent correspondingly in the column such that any two of the stacked pair are free from having an instance of another cell region therebetween.

In some embodiments, the second cell region is a first instance thereof, and the forming active regions further includes: forming additional instances of the first cell region; and separating neighboring instances of the stacked pair by locating corresponding additional instances of the first cell region therebetween.

In some embodiments, the first cell region is a first instance thereof, and the forming active regions further includes: forming additional instances of the second cell region; and separating neighboring instances of the row pair by locating corresponding additional instances of the second cell region therebetween.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A cell region of a device, the cell region comprising:
a first active region having a first type of dopant over a second active region having a second type of dopant different than the first type of dopant;
in a first layer of metallization (M_first layer) over the first active region:
an M_first power grid (PG) segment configured for a first reference voltage; and
M_first routing segments aligned to a first quantity of M_first routing tracks; and
in a first layer of metallization (BM_first layer) under the second active region:
a BM_first PG segment configured for a second reference voltage different than the first reference voltage; and
BM_first routing segments aligned to a second quantity of BM_first routing tracks, the second quantity being smaller than the first quantity.

2. The cell region of claim 1, wherein:
the second quantity of BM_first routing tracks is j, where j is a positive integer; and
the first quantity of M_first routing tracks is j+1.

3. The cell region of claim 2, wherein:
1≤j.

4. The cell region of claim 3, wherein:

$$1 \le j \le 2.$$

5. A device comprising:
a first cell region stacked on a second cell region;
each of the first and second cell regions including:
a first active region having a first type of dopant over a second active region having a second type of dopant different than the first type of dopant;

in a first layer of metallization (M_first layer) over the first active region:

M_first power grid (PG) segments having a first reference voltage; and

M_first routing segments aligned correspondingly to M_first routing tracks; and in a first layer of metallization (BM_first layer) under the second active region:

BM_first PG segments having a second reference voltage different than the first reference voltage; and BM_first routing segments aligned correspondingly to BM_first routing tracks;

ones of the M_first routing segments being aligned in the first and second cell regions correspondingly to first and second quantities of the M_first routing tracks, the second quantity being smaller than the first quantity; and ones of the BM_first routing segments being aligned in the first and second cell regions correspondingly to third and fourth quantities of the BM_first routing tracks, the fourth quantity being smaller than the third quantity.

6. The device of claim 5, wherein:

the second quantity of M_first routing tracks is j, where j is a positive integer;

the first quantity of M_first routing tracks is j+1;

the fourth quantity of BM_first routing tracks is k, where k is a positive integer; and the third quantity of BM_first routing tracks is k+1.

7. The device of claim 6, wherein:

$$k=j+1.$$

8. The device of claim 6, wherein:

k≤j.

9. The device of claim 5, wherein:

the first cell region is stacked on the second cell region relative to a first direction;

the first and second cell regions represent a first instance of a stacked pair;

the first and second cell regions are in a column extending in the first direction; and the device further comprises other instances of the stacked pair in the column.

10. The device of claim 9, wherein:

the first instance and other instances of the stacked pair are adjacent correspondingly in the column such that any two of the stacked pair are free from having an instance of another cell region therebetween.

11. The device of claim 9, wherein:

the first and second cell regions are corresponding first instances thereof; and neighboring instances of the stacked pair are separated correspondingly by other instances of the first cell region.

12. The device of claim 9, wherein:

the first and second cell regions are corresponding first instances thereof; and neighboring instances of the stacked pair are separated correspondingly by other instances of the second cell region.

13. A method of forming a device, the method comprising:

forming active regions including upper active regions having a first type of dopant correspondingly over lower active regions having a second type of dopant different than the first type of dopant, the active regions including:

a first upper active region correspondingly over a first lower active region that together represent a first cell region; and a second upper active region correspondingly over a second lower active region that together represent a second cell region; and forming first conductors in a first layer of metallization (M_first layer) correspondingly over the upper active regions, the first conductors including:

first and second M_first power grid (PG) segments over correspondingly the first and second cell regions and being configured for a first reference voltage;

first M_first routing segments over the first cell region, correspondingly aligned to a first quantity of M_first routing tracks and being configured for corresponding routing signals; and second M_first routing segments over the second cell region, correspondingly aligned to a second quantity of M_first routing tracks and being configured for corresponding routing signals, the second quantity being smaller than the first quantity; and forming second conductors in a first layer of metallization (BM_first layer) correspondingly under the lower active regions, the second conductors including:

first and second BM_first PG segments correspondingly under the first and second cell regions and being configured for a second reference voltage different than the first reference voltage;

first BM_first routing segments under the first cell region, correspondingly aligned to a third quantity of BM_first routing tracks and being configured for corresponding routing signals; and second BM_first routing segments under the second cell region, correspondingly aligned to a fourth quantity of BM_first routing tracks and being configured for corresponding routing signals, the fourth quantity being smaller than the third quantity.

14. The method of claim 13, wherein:

the second quantity of M_first routing tracks is j, where j is a positive integer;

the first quantity of M_first routing tracks is j+1;

the fourth quantity of BM_first routing tracks is k, where k is a positive integer; and the first quantity of BM_first routing tracks is k+1.

15. The method of claim 14, wherein:

$$k=j+1.$$

16. The method of claim 14, wherein:

k≤j.

17. The method of claim 13, wherein:

the first cell region is stacked on the second cell region cell relative to a first direction;

the forming active regions further includes:

forming the first upper active region and the first lower active region in a first location in a column that extends in a first direction;

forming the second upper active region and the second lower active region in a second location in the column such that the second cell region is stacked on the first cell region;

the first and second cell regions represent a first instance of a stacked pair; and the forming active regions yet further includes:

forming other instances of the stacked pair in the column.

18. The method of claim 17, wherein the forming active regions further includes:

locating the first instance and other instances of the stacked pair to be adjacent correspondingly in the column such that any two of the stacked pair are free from having an instance of another cell region therebetween.

19. The method of claim 17, wherein:

the second cell region is a first instance thereof; and the forming active regions further includes:

forming additional instances of the first cell region; and separating neighboring instances of the stacked pair by locating corresponding additional instances of the first cell region therebetween.

20. The method of claim 17, wherein:

the first cell region is a first instance thereof; and the forming active regions further includes:

forming additional instances of the second cell region; and separating neighboring instances of the stacked pair by locating corresponding additional instances of the second cell region therebetween.

* * * * *